US011031392B2

(12) United States Patent
Jeon et al.

(10) Patent No.: US 11,031,392 B2
(45) Date of Patent: Jun. 8, 2021

(54) INTEGRATED CIRCUIT DEVICE HAVING A WORK FUNCTION CONTROL LAYER WITH A STEP PORTION LOCATED ON AN ELEMENT ISOLATION LAYER

(71) Applicant: Samsung Electronics Co., Ltd., Suwon-si (KR)

(72) Inventors: Yongho Jeon, Suwon-si (KR); Sekoo Kang, Suwon-si (KR); Sungwoo Myung, Suwon-si (KR); Keunhee Bai, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/703,908

(22) Filed: Dec. 5, 2019

(65) Prior Publication Data

US 2020/0312844 A1 Oct. 1, 2020

(30) Foreign Application Priority Data

Mar. 25, 2019 (KR) ........................ 10-2019-0033740

(51) Int. Cl.
*H01L 27/088* (2006.01)
*H01L 29/49* (2006.01)
(Continued)

(52) U.S. Cl.
CPC ...... *H01L 27/0886* (2013.01); *H01L 21/0332* (2013.01); *H01L 21/0334* (2013.01);
(Continued)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/42384–42392; H01L 29/0673; H01L 29/78696; H01L 29/42392; H01L 29/66439;
(Continued)

(56) References Cited

U.S. PATENT DOCUMENTS 9,972,542 B1 5/2018 Bi et al.
9,972,623 B1 * 5/2018 Lin ..................... H01L 27/0924
(Continued)

*Primary Examiner* — Younes Boulghassoul
(74) *Attorney, Agent, or Firm* — Muir Patent Law, PLLC

(57) ABSTRACT

An integrated circuit device includes a first fin-type active area and a second fin-type active area protruding from a substrate and extending in a first direction, an element isolation layer between the first and second fin-type active areas on the substrate, first semiconductor patterns being on a top surface of the first fin-type active area and having channel areas, second semiconductor patterns being on a top surface of the second fin-type active area and having channel areas, a first gate structure extending on the first fin-type active area in a second direction and including a first work function control layer surrounding the first semiconductor patterns and comprising a step portion on the element isolation layer, and a second gate structure extending on the second fin-type active area in the second direction and including a second work function control layer surrounding the second semiconductor patterns.

18 Claims, 39 Drawing Sheets

(51) Int. Cl.
*H01L 29/423* (2006.01)
*H01L 29/51* (2006.01)
*H01L 29/66* (2006.01)
*H01L 29/06* (2006.01)
*H01L 29/786* (2006.01)
*H01L 27/092* (2006.01)
*H01L 21/8238* (2006.01)
*H01L 21/033* (2006.01)
*H01L 21/84* (2006.01)
*H01L 21/28* (2006.01)
*H01L 27/12* (2006.01)

(52) U.S. Cl.
CPC ............... *H01L 21/28088* (2013.01); *H01L 21/823814* (2013.01); *H01L 21/823821* (2013.01); *H01L 21/823842* (2013.01); *H01L 21/845* (2013.01); *H01L 27/0924* (2013.01); *H01L 29/0673* (2013.01); *H01L 29/42368* (2013.01); *H01L 29/42372* (2013.01); *H01L 29/42376* (2013.01); *H01L 29/42392* (2013.01); *H01L 29/4966* (2013.01); *H01L 29/512* (2013.01); *H01L 29/66439* (2013.01); *H01L 29/66545* (2013.01); *H01L 29/66553* (2013.01); *H01L 29/78696* (2013.01); *H01L 27/1211* (2013.01); *H01L 29/0653* (2013.01)

(58) Field of Classification Search
CPC . H01L 27/092–0924; H01L 21/823842; H01L 21/82385; H01L 21/82345; H01L 21/28088; H01L 29/4966; H01L 29/42368; H01L 29/42376
See application file for complete search history.

(56) References Cited

U.S. PATENT DOCUMENTS

| | | | |
|---|---|---|---|
| 9,997,519 B1* | 6/2018 | Bao | H01L 29/4966 |
| 10,038,053 B2 | 7/2018 | Balakrishnan et al. | |
| 10,103,065 B1* | 10/2018 | Mochizuki | H01L 29/401 |
| 10,490,559 B1* | 11/2019 | Ando | H01L 29/401 |
| 10,720,431 B1* | 7/2020 | Cheng | H01L 21/823828 |
| 2016/0254261 A1* | 9/2016 | Machkaoutsan | H01L 27/0924 257/369 |
| 2018/0151451 A1 | 5/2018 | Li | |
| 2018/0151573 A1 | 5/2018 | Li | |
| 2018/0315667 A1* | 11/2018 | Kwon | B82Y 10/00 |
| 2018/0337099 A1* | 11/2018 | Zhou | H01L 21/32135 |
| 2018/0342427 A1 | 11/2018 | Xie et al. | |
| 2018/0350955 A1* | 12/2018 | Chen | H01L 29/4958 |
| 2020/0043808 A1* | 2/2020 | Bao | H01L 21/3215 |
| 2020/0083326 A1* | 3/2020 | Ok | H01L 27/092 |

* cited by examiner

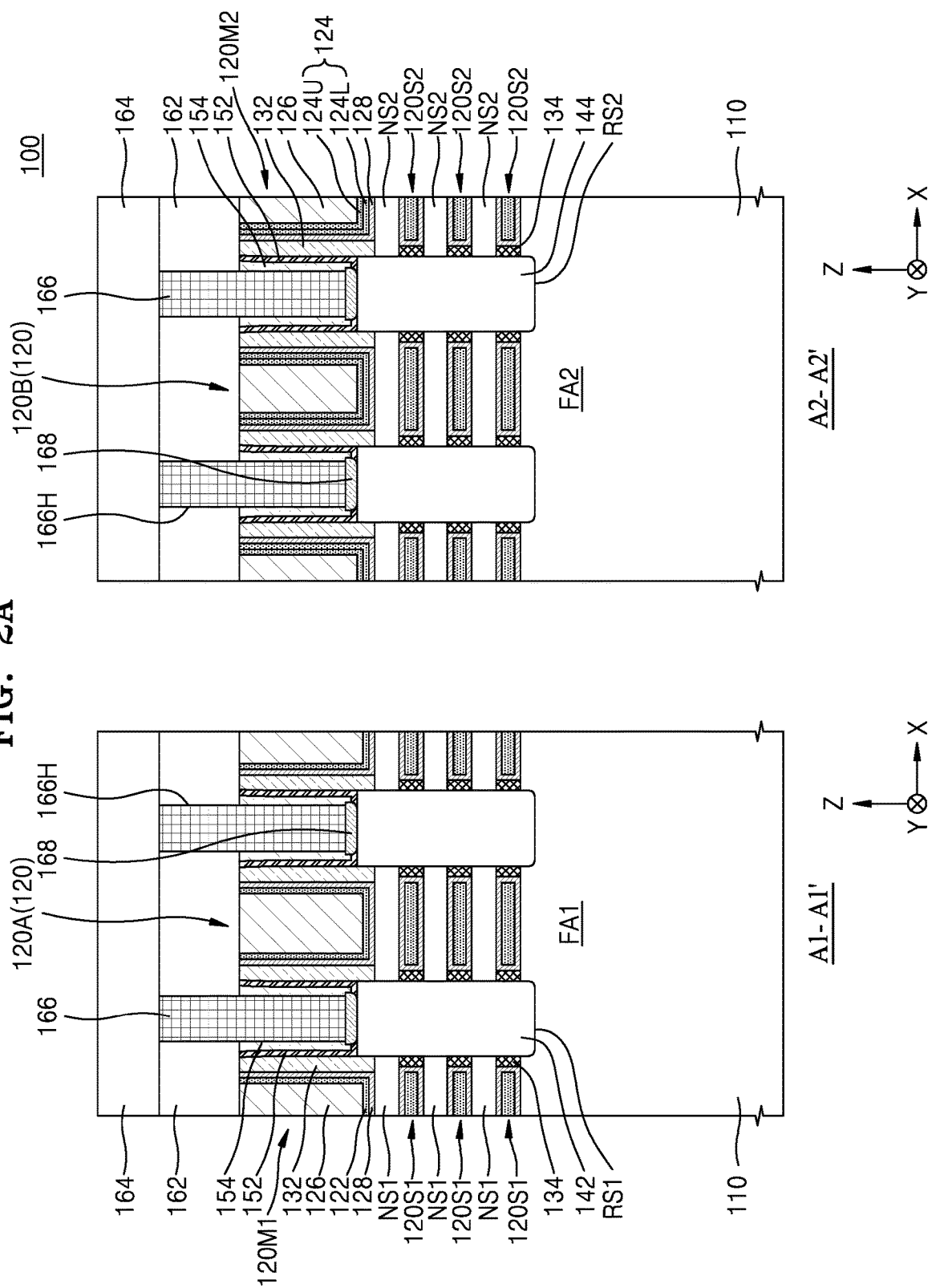

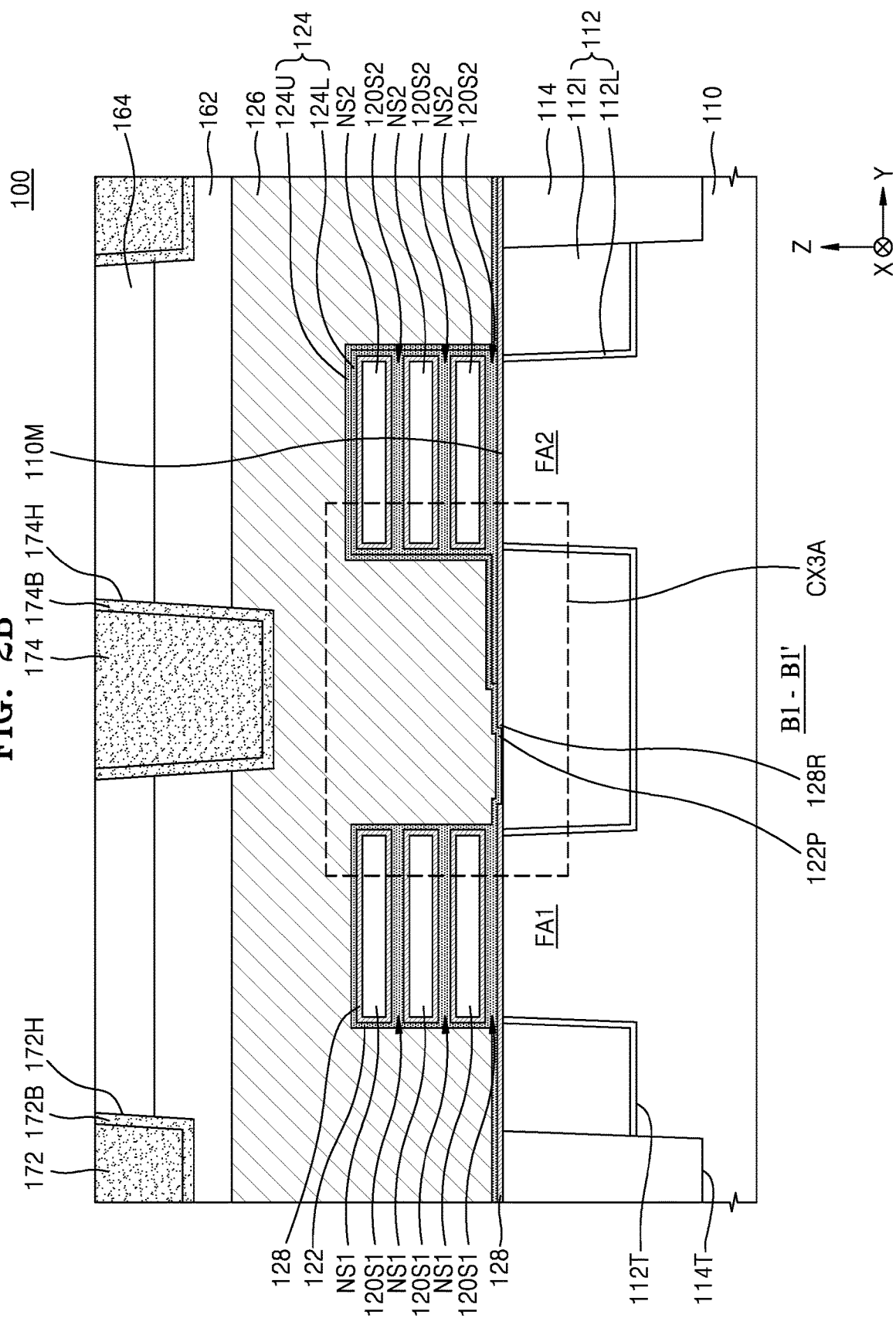

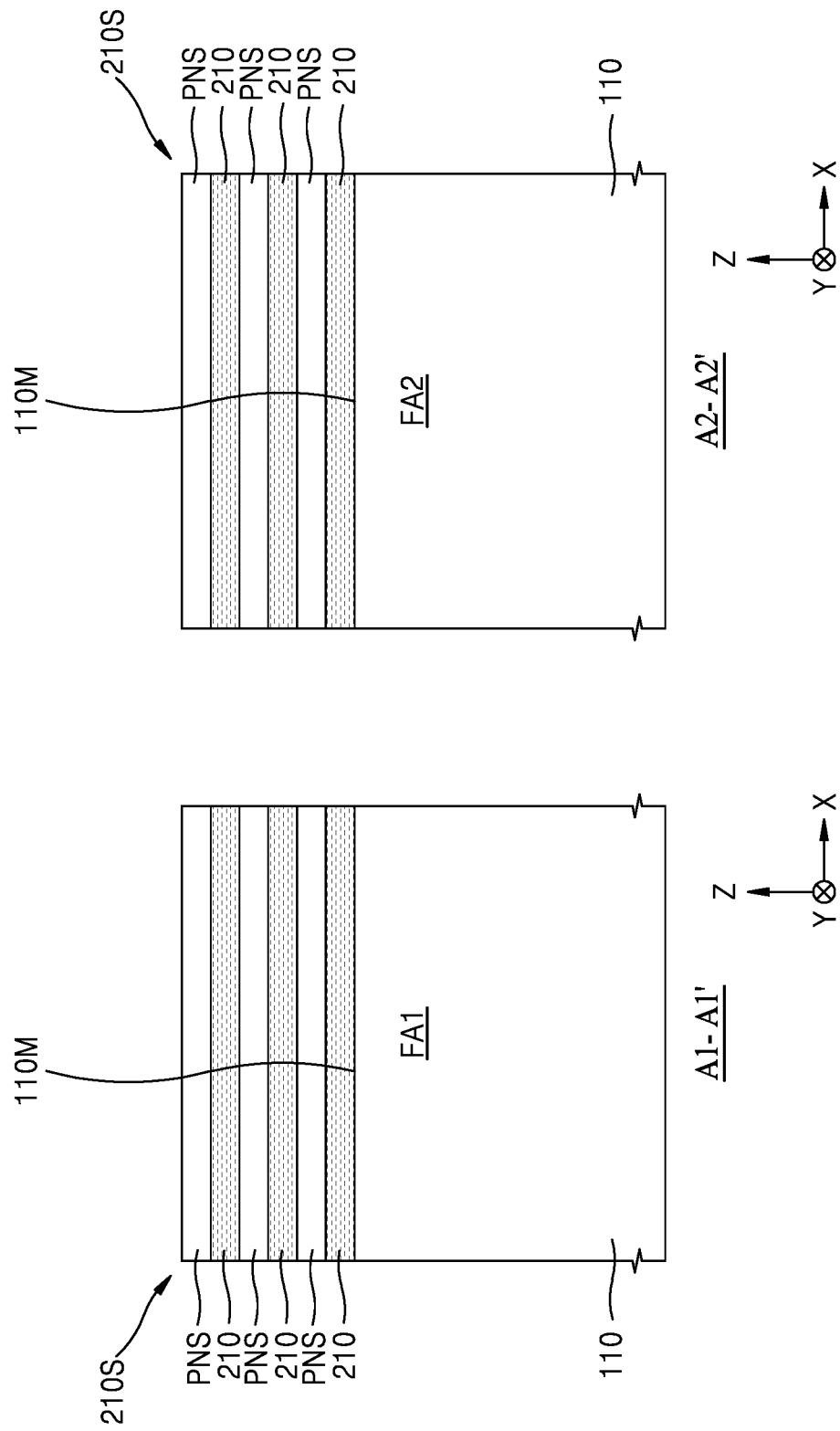

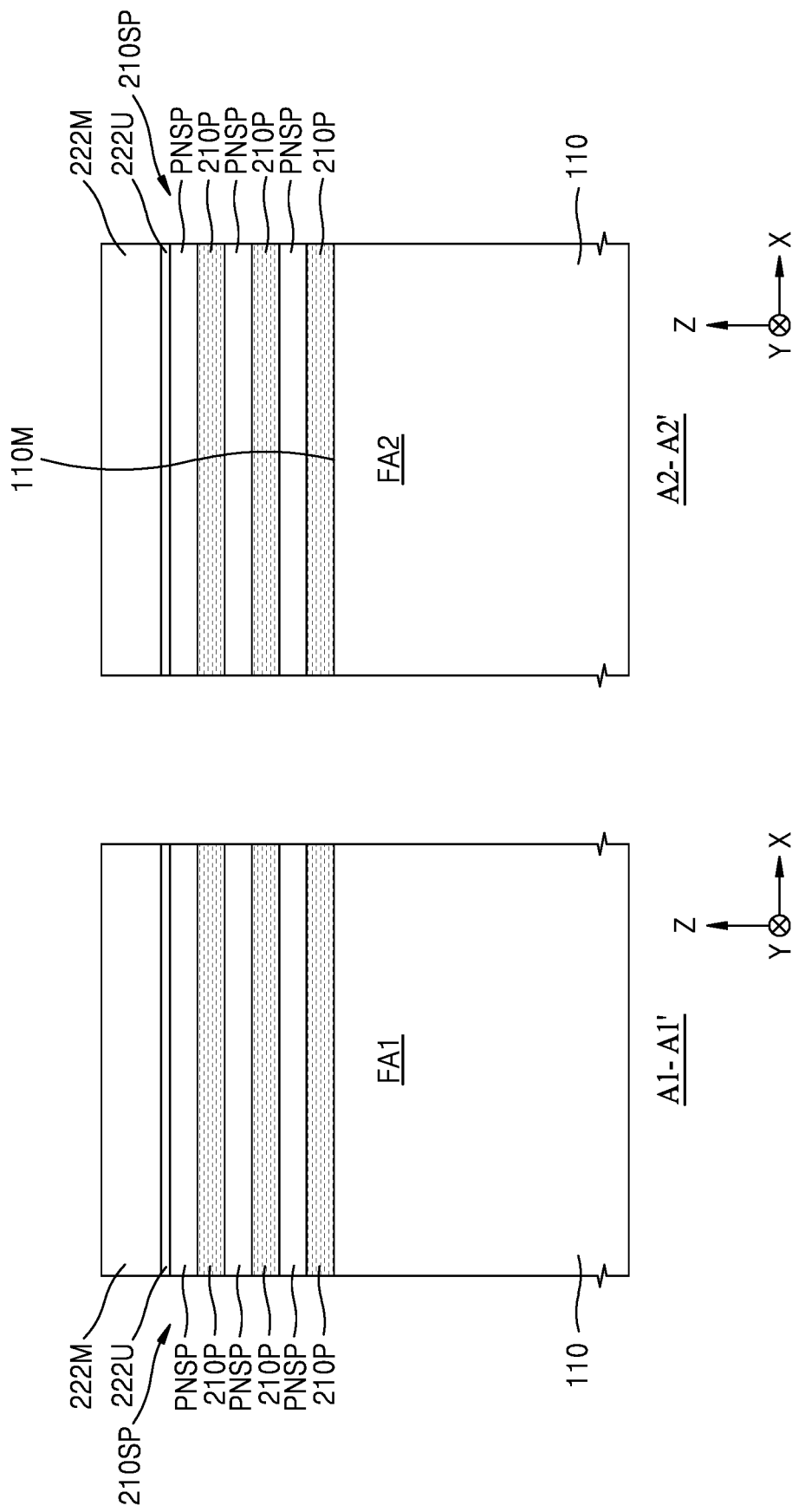

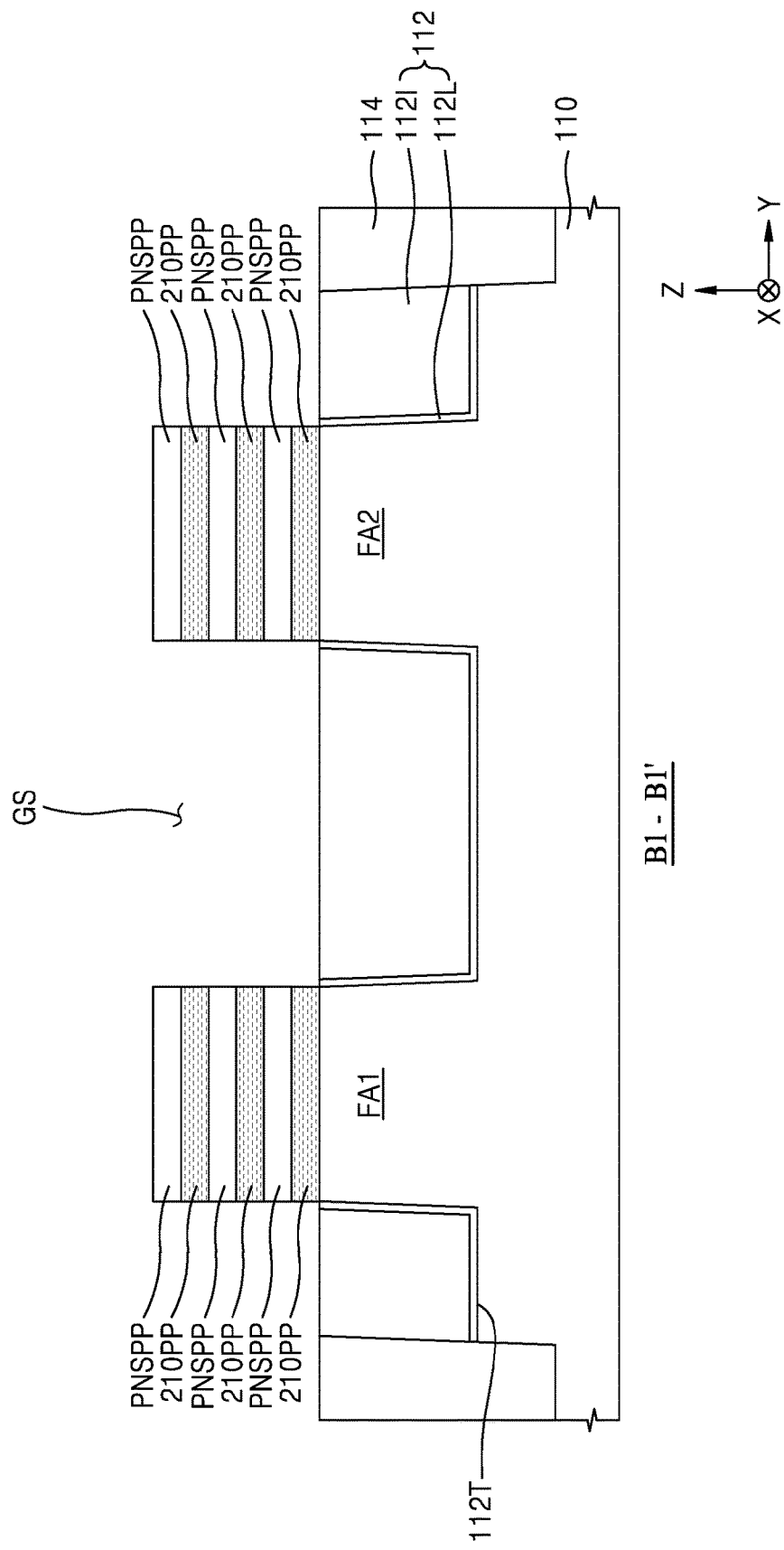

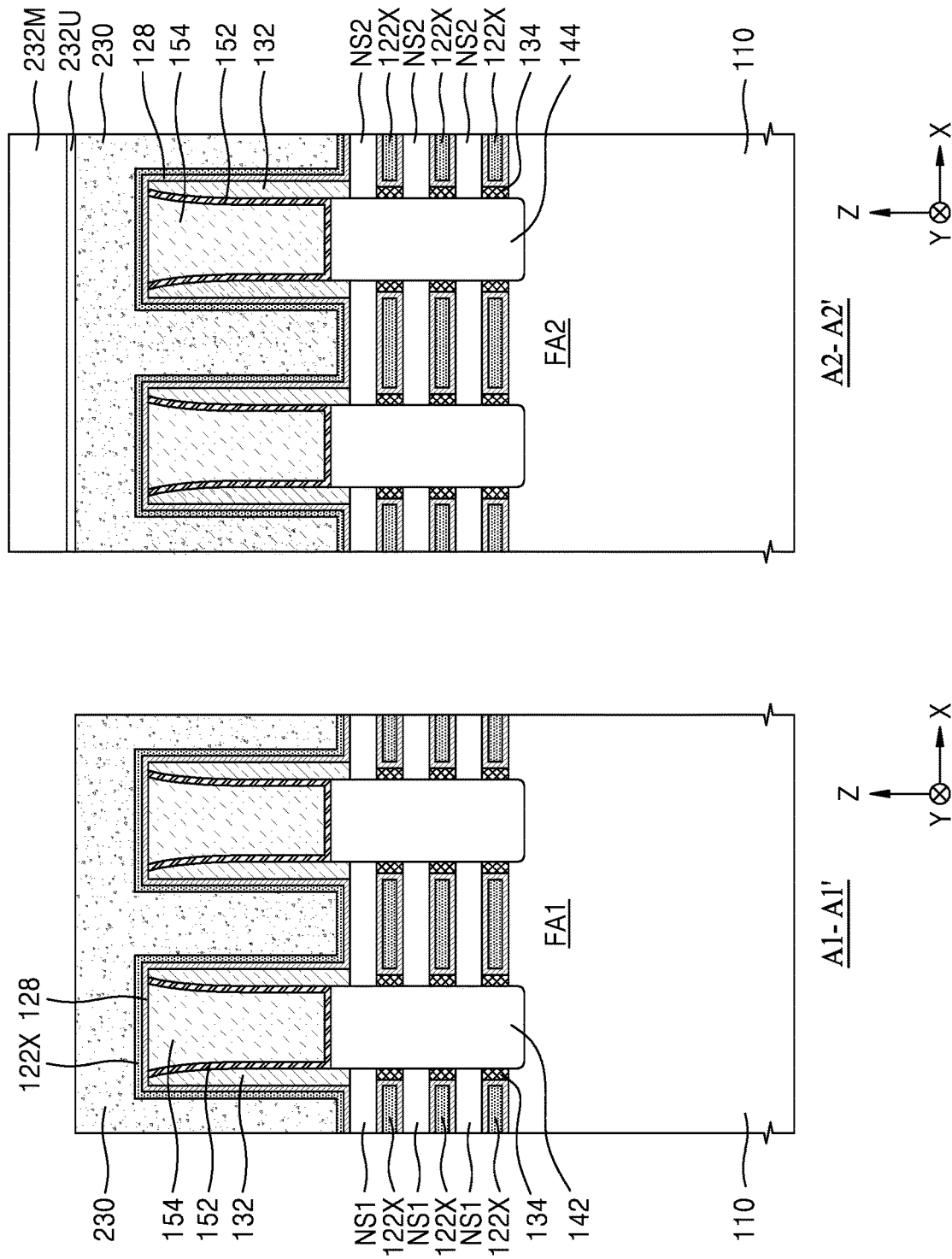

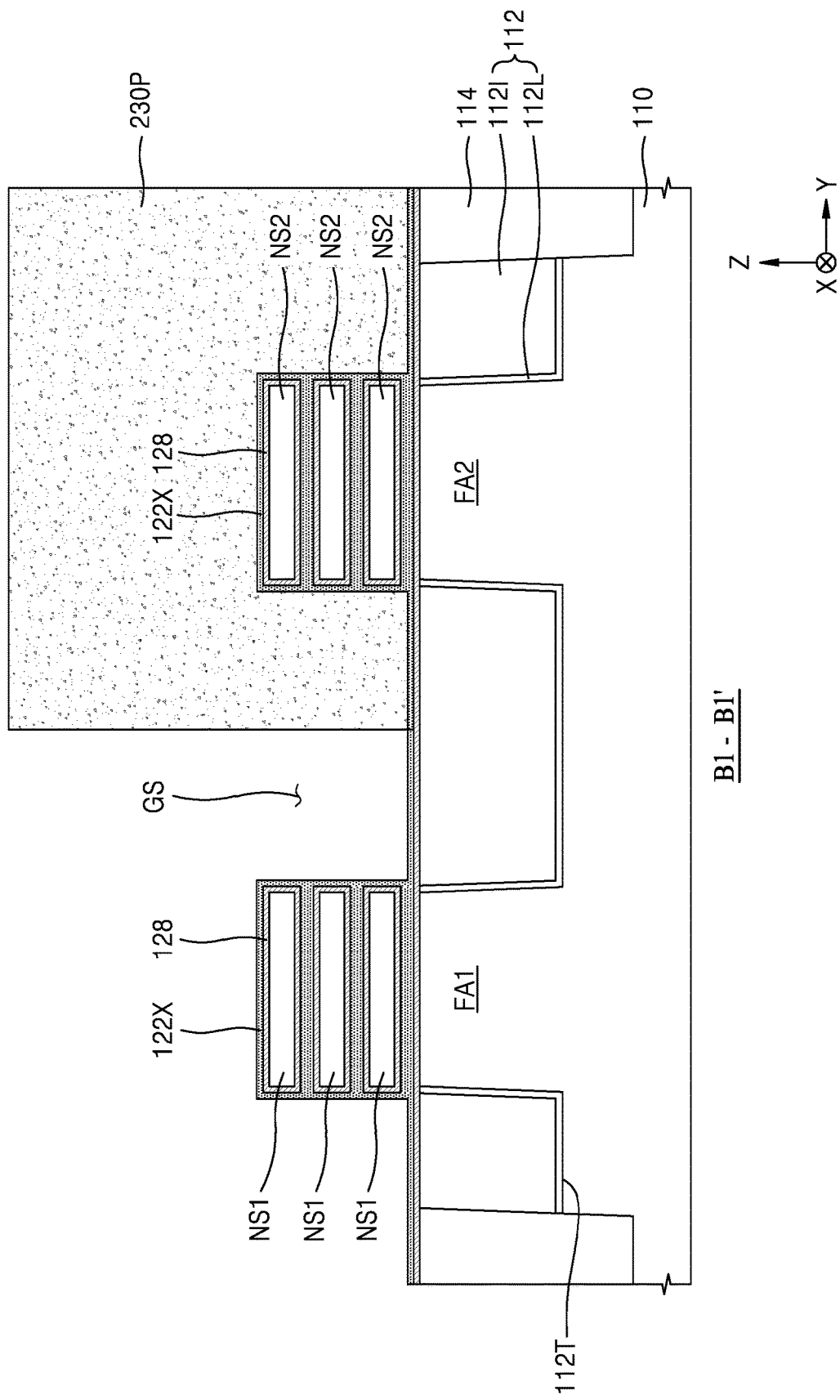

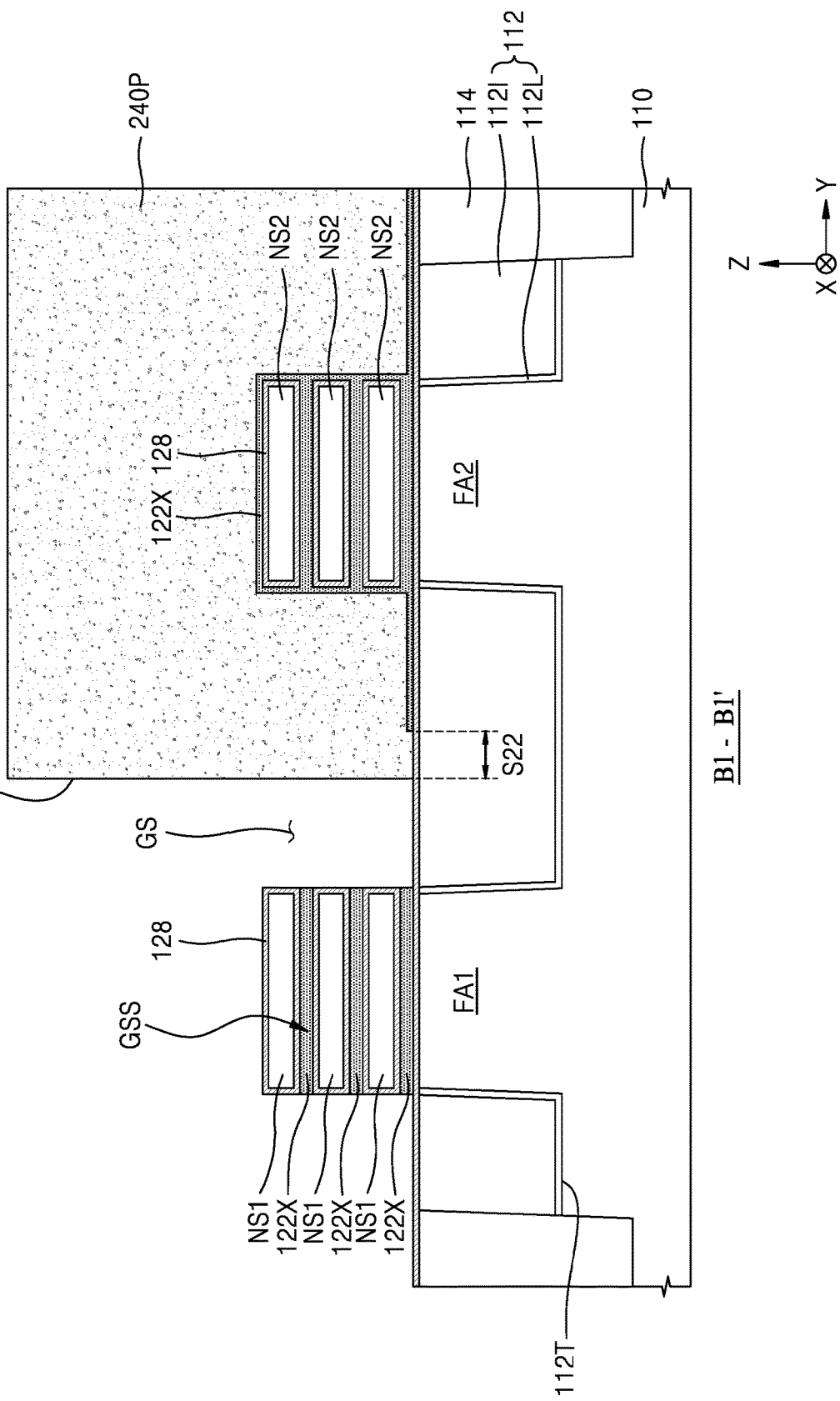

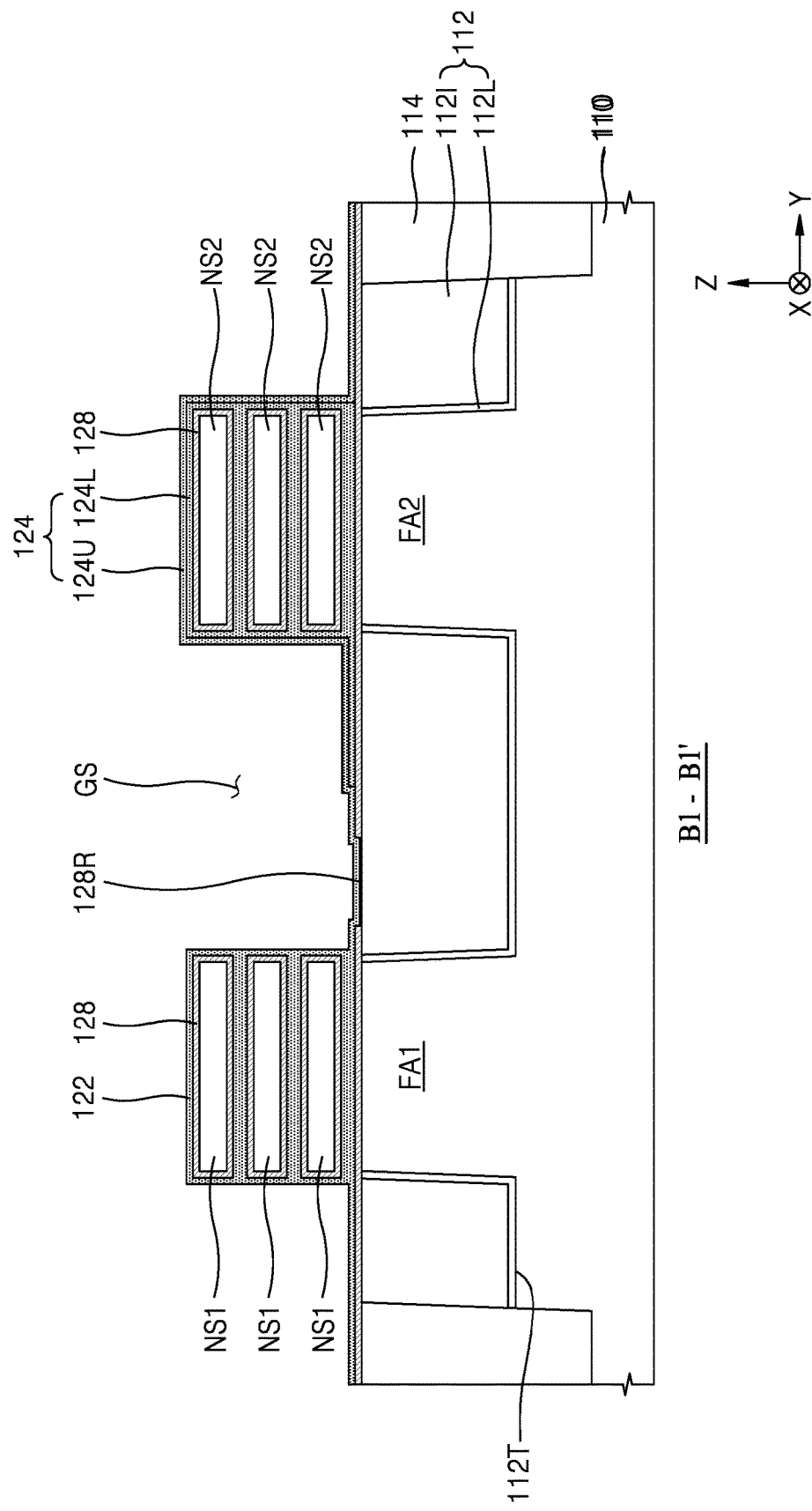

INTEGRATED CIRCUIT DEVICE HAVING A WORK FUNCTION CONTROL LAYER WITH A STEP PORTION LOCATED ON AN ELEMENT ISOLATION LAYER

CROSS-REFERENCE TO RELATED APPLICATION

This application claims the benefit of Korean Patent Application No. 10-2019-0033740, filed on Mar. 25, 2019, in the Korean Intellectual Property Office, the disclosure of which is incorporated herein in its entirety by reference.

BACKGROUND

The inventive concept relates to an integrated circuit device and a method of manufacturing the same, and more particularly, to an integrated circuit device including a transistor having a multi-gate structure and a method of manufacturing the integrated circuit device.

Due to the development of electronic technology, the demand for high integration of integrated circuit devices is increasing and downscaling of the integrated circuit devices is proceeding. Down-scaling of the integrated circuit devices has caused a short channel effect of transistors, which reduces reliability of the integrated circuit devices. To reduce the short channel effect, an integrated circuit device having a multi-gate structure, such as a nanosheet type transistor, has been proposed.

SUMMARY

The present disclosure provides an integrated circuit device capable of precisely controlling a threshold voltage and having optimized performance.

The present disclosure provides a method of manufacturing an integrated circuit device capable of precisely controlling a threshold voltage and having optimized performance.

According to an exemplary embodiment of the inventive concept, there is provided an integrated circuit device including a first fin-type active area protruding from a substrate and extending in a first direction, a second fin-type active area protruding from the substrate, the second fin-type active area being spaced apart from the first fin-type active area in a second direction perpendicular to the first direction, an element isolation layer between the first fin-type active area and the second fin-type active area on the substrate, a plurality of first semiconductor patterns on a top surface of the first fin-type active area and each of the plurality of first semiconductor patterns having a channel area, a plurality of second semiconductor patterns on a top surface of the second fin-type active area and each of the plurality of second semiconductor patterns having a channel area, a first gate structure extending on the first fin-type active area in the second direction different from the first direction, the first gate structure including a first work function control layer surrounding each of the plurality of first semiconductor patterns and including a step portion on the element isolation layer, and a second gate structure extending on the second fin-type active area in the second direction, the second gate structure including a second work function control layer surrounding each of the plurality of second semiconductor patterns.

According to an exemplary embodiment of the inventive concept, there is provided an integrated circuit device including a first fin-type active area protruding from a substrate and extending in a first direction, a second fin-type active area protruding from the substrate, the second fin-type active area being spaced apart from the first fin-type active area in a second direction perpendicular to the first direction, an element isolation layer between the first fin-type active area and the second fin-type active area on the substrate, a plurality of first semiconductor patterns being spaced apart from a top surface of the first fin-type active area and each of the plurality of first semiconductor patterns having a channel area, a plurality of second semiconductor patterns being spaced apart from a top surface of the second fin-type active area and each of the plurality of second semiconductor patterns having a channel area, a first work function control layer including a first portion surrounding each of the plurality of first semiconductor patterns and a second portion extending from the first portion onto the element isolation layer, the second portion of the first work function control layer including a step portion on the element isolation layer and having a first thickness, and a second work function control layer including a third portion surrounding each of the plurality of second semiconductor patterns and a fourth portion extending from the third portion onto the element isolation layer, the third portion of the second work function control layer having a second thickness that is greater than the first thickness.

According to an exemplary embodiment of the inventive concept, there is provided an integrated circuit device including a buried insulation layer on a substrate, a first active area, a second active area and an element isolation layer on the buried insulation layer, the first active area and the second active area being arranged spaced apart from each other by the element isolation layer, a plurality of first semiconductor patterns on the first active area, the plurality of first semiconductor patterns being spaced apart from a top surface of the first active area and each of the plurality of first semiconductor patterns having a channel area, a plurality of second semiconductor patterns on the second active area, the plurality of second semiconductor patterns being spaced apart from a top surface of the second active area and each of the plurality of second semiconductor patterns having a channel area, a first work function control layer including a first portion surrounding each of the plurality of first semiconductor patterns and a second portion extending from the first portion onto the element isolation layer, the second portion of the first work function control layer including a step portion on the element isolation layer and having a first thickness, and a second work function control layer including a third portion surrounding each of the plurality of second semiconductor patterns and a fourth portion extending from the third portion onto the element isolation layer, the fourth portion of the second work function control layer having a second thickness greater than the first thickness. The step portion is positioned at a predetermined distance from an end portion of the fourth portion of the second work function control layer.

BRIEF DESCRIPTION OF THE DRAWINGS

Embodiments of the inventive concept will be more clearly understood from the following detailed description taken in conjunction with the accompanying drawings in which:

FIG. 2A illustrates cross-sectional views taken along line A1-A1' and line A2-A2' in FIG. 1, and FIG. 2B is a cross-sectional view taken along line B1-B1' in FIG. 1;

FIGS. 7A through 25B are cross-sectional views for describing a method of manufacturing an integrated circuit device according to embodiments, where FIGS. 7A, 8A, 11A, 12 through 15, 16A, 17A, 18A, 19A, 20A, 21A, 22A, 23A, 24A, and 25A illustrate cross-sections taken along line A1-A1' and line A2-A2' in FIG. 1 according to the process sequence, and FIGS. 7B, 8B, 9, 10, 11B, 16B, 17B, 18B, 19B, 20B, 21B, 22B, 23B, 24B, and 25B illustrate cross-sections taken along line B1-B1' in FIG. 1 according to the process sequence.

DETAILED DESCRIPTION OF THE EMBODIMENTS

Hereinafter, embodiments of the inventive concept will be described in detail with reference to the accompanying drawings. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Figure 1:
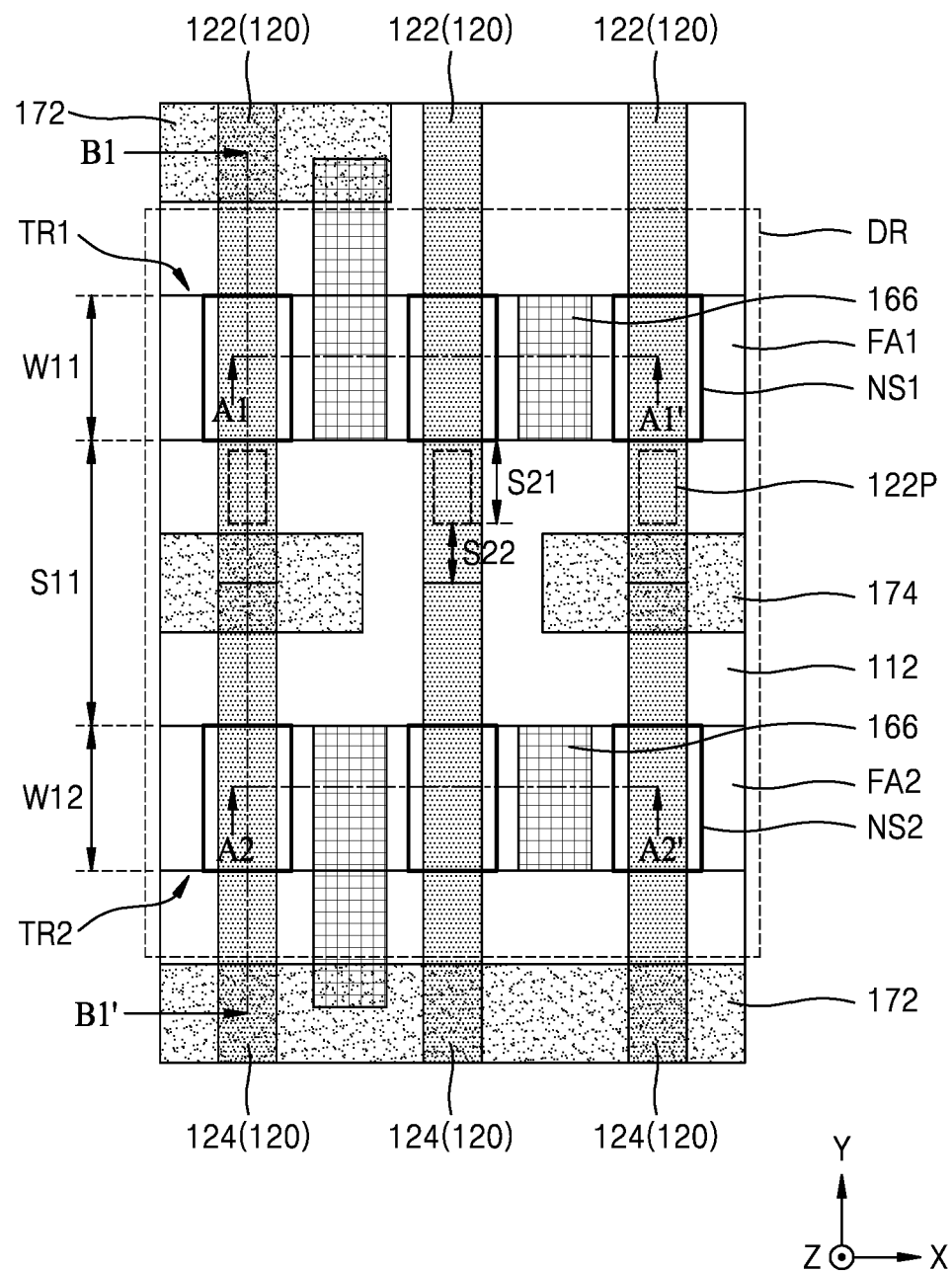
FIG. 1 is a layout diagram of an integrated circuit device according to example embodiments.
Figure 3A:
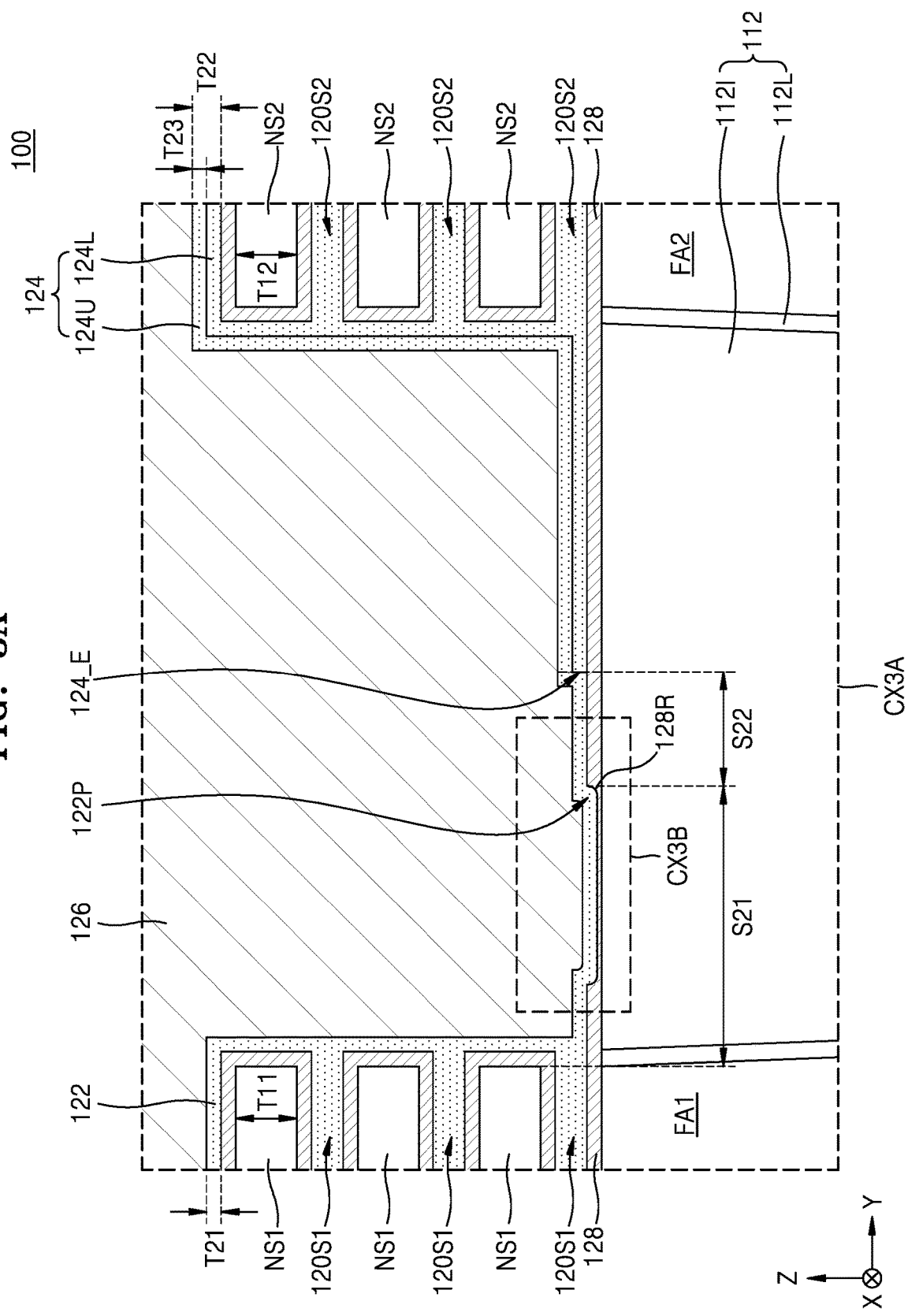
FIG. 3A is an enlarged view of a region CX3A in FIG. 2B.
Figure 3B:
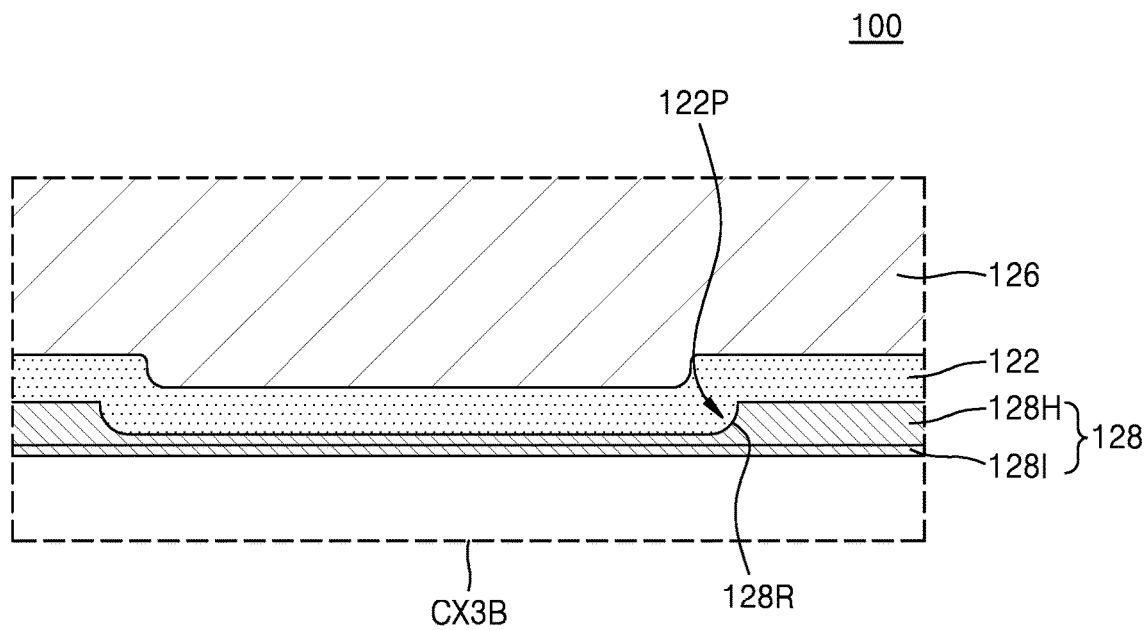
FIG. 3B is an enlarged view of a region CX3B in FIG. 3A.

FIG. 1 is a layout diagram of an integrated circuit device 100 according to example embodiments. FIG. 2A illustrates cross-sectional views taken along line A1-A1' and line A2-A2' in FIG. 1, FIG. 2B is a cross-sectional view taken along line B1-B1' in FIG. 1, FIG. 3A is an enlarged view of a region CX3A in FIG. 2B, and FIG. 3B is an enlarged view of a region CX3B in FIG. 3A.

Referring to FIGS. 1 through 3B, a substrate 110 may be provided with a first fin-type active area FA1 and a second fin-type active area FA2. In an example embodiment, the first fin-type active area FA1 and the second fin-type active area FA2 may be formed by being epitaxially grown from the substrate 110 or by etching the substrate 110. The first fin-type active area FA1 and the second fin-type active area FA2 may constitute a first transistor TR1 and a second transistor TR2, respectively. In example embodiments, the first transistor TR1 may include an NMOS transistor, and the second transistor TR2 may include a PMOS transistor. In other embodiments, the first transistor TR1 may include an NMOS transistor having a first threshold voltage, and the second transistor TR2 may include a PMOS transistor having a second threshold voltage that is different from the first threshold voltage.

The substrate 110 may include a semiconductor material such as Si and Ge, or may include a compound semiconductor material such as SiGe, SiC, GaAs, InAs, and InP. In some embodiments, the substrate 110 may include at least one of a Group III-V material and a Group IV material. The Group III-V material may be a binary, ternary, or quaternary compound including at least one Group III element and at least one Group V element. The Group III-V material may be a compound containing at least one element of In, Ga, and Al as a Group III element and at least one element of As, P, and Sb as a Group V element. For example, the Group III-V material may be selected from InP, $In_zGa_{1-z}As$ ($0 \le z \le 1$), and $Al_zGa_{1-z}As$ ($0 \le z \le 1$). The binary compound may include, for example, InP, GaAs, InAs, InSb, or GaSb. The ternary compound may include any one of InGaP, InGaAs, AlInAs, InGaSb, GaAsSb, or GaAsP. The Group IV material may include Si or Ge. However, the Group III-V material and the Group IV material usable in the integrated circuit device 100 according to the inventive concept are not limited to those described above. The Group III-V material and the Group IV material such as Ge may be used as a channel material capable of forming a low-power, high-speed transistor. A semiconductor substrate including a Group III-V material having a higher electron mobility than that of a Si-based semiconductor substrate, for example, a GaAs-based semiconductor substrate, and a semiconductor substrate having a higher hole mobility than that of the Si-based semiconductor substrate, for example, a Ge-based semiconductor substrate may be used to form a high-performance CMOS. In some embodiments, when forming the NMOS transistor on the substrate 110, the substrate 110 may include any one of the above-exemplified Group III-V materials. In some other embodiments, when forming the PMOS transistor on the substrate 110, at least a portion of the substrate 110 may include Ge. In another example, the substrate 110 may have a semiconductor on insulator (SOI) structure. The substrate 110 may include a conductive region, for example, a well doped with impurities, or a structure doped with impurities.

Each of the first fin-type active area FA1 and the second fin-type active area FA2 may extend in a first direction (X direction) on the substrate 110, and protrude in the vertical direction (Z direction) from a top surface of the substrate 110. The second fin-type active area FA2 may be arranged spaced apart from the first fin-type active area FA1 in a second direction (Y direction) perpendicular to the first direction (X direction).

On the substrate 110, an element isolation trench 112T defining the first fin-type active area FA1 and the second fin-type active area FA2 may be formed, and a deep trench 114T defining an element region DR may be formed. An element isolation layer 112 may be in the element isolation trench 112T, and a deep trench insulation layer 114 may be in the deep trench 114T.

For example, the element isolation layer 112 may be between the first fin-type active area FA1 and the second fin-type active area FA2, and may include an element isolation liner 112L formed conformally on an inner wall of the element isolation trench 112T, and a gap fill isolation layer 112I filling the inside of the element isolation trench 112T on the element isolation liner 112L. FIG. 2B illustrates an example in which a top surface of the element isolation layer 112 is at the same level as top surfaces of the first and second fin-type active areas FA1 and FA2. However, unlike this case, the top surface of the element isolation layer 112 may be positioned lower than the top surfaces of the first and second fin-type active areas FA1 and FA2, and only bottom portions on side walls of the first and second fin-type active areas FA1 and FA2 may be surrounded by the element isolation layer 112. The deep trench insulation layer 114 may include silicon oxide, silicon nitride, or a combination thereof.

A plurality of first semiconductor patterns NS1 may be arranged spaced apart from the top surface of the first fin-type active area FA1 in the vertical direction (Z direction) perpendicular to the top surface of the first fin-type active area FA1. The plurality of first semiconductor patterns NS1 may include the same material as the substrate 110. For example, the plurality of first semiconductor patterns NS1 may include a semiconductor material such as Si and Ge, or a compound semiconductor material such as SiGe, SiC, GaAs, InAs, and InP. Each of the plurality of first semiconductor patterns NS1 may include a channel region.

Each of the plurality of first semiconductor patterns NS1 may have a relatively large first width W11 in the second direction (Y direction) and a relatively small first thickness T11 in the vertical direction (Z direction), and for example, may have a nanosheet shape. In the example embodiments, each of the plurality of first semiconductor patterns NS1 may have the first width W11 ranging from about 5 nm to about 100 nm, and each of the plurality of first semiconductor patterns NS1 may have the first thickness T11 ranging from about 1 nm to about 10 nm, but the embodiments are not limited thereto.

As illustrated in FIG. 2B, the plurality of first semiconductor patterns NS1 may be arranged spaced apart from each other at an equal distance. However, the inventive concept is not limited thereto, and the plurality of first semiconductor patterns NS1 may be arranged spaced apart from each other at different distances. In addition, the number of first semiconductor patterns NS1 is not limited to those illustrated in FIGS. 2A and 2B.

A plurality of second semiconductor patterns NS2 may be arranged spaced apart from the top surface of the second fin-type active area FA2 in the vertical direction (Z direction) perpendicular to the top surface of the second fin-type active area FA2. The plurality of second semiconductor patterns NS2 may include the same material as the substrate 110, and each of the plurality of second semiconductor patterns NS2 may include a channel region.

Each of the plurality of second semiconductor patterns NS2 may have a relatively large second width W12 in the second direction (Y direction) and a relatively small second thickness T12 in the vertical direction (Z direction), and for example, may have a nanosheet shape. In the example embodiments, the second width W12 of each of the plurality of second semiconductor patterns NS2 may be the same as or different from the first width W11 of each of the plurality of first semiconductor patterns NS1. In addition, the second thickness T12 of each of the plurality of second semiconductor patterns NS2 may be equal to the first thickness T11 of each of the plurality of first semiconductor patterns NS1, but the present invention is not limited thereto.

A gate structure 120 may include a first gate structure 120A and a second gate structure 120B. The first gate structure 120A may extend in a second direction (Y direction) on the first fin-type active area FA1 and surround each of the plurality of first semiconductor patterns NS1. The first gate structure 120A may include a first main gate portion 120M1 covering a top surface of the uppermost first semiconductor pattern of the plurality of first semiconductor patterns NS1, and a plurality of first sub-gate portions 120S1 disposed between the uppermost first semiconductor pattern and the top surface of the first fin-type active area FA1. Each of the plurality of first sub-gate portions 120S1 may be disposed in a corresponding space of spaces between the first fin-type active area FA1 and the lowermost first semiconductor pattern of the plurality of first semiconductor patterns NS1 and between two adjacent first semiconductor patterns of the plurality of first semiconductor patterns NS1. The second gate structure 120B may extend in the second direction on the second fin-type active area FA2 and surround each of the plurality of second semiconductor patterns NS2. The second gate structure 120B may include a second main gate portion 120M2 covering a top surface of the uppermost second semiconductor pattern of the plurality of second semiconductor patterns NS2, and a plurality of second sub-gate portions 120S2 disposed between the uppermost second semiconductor pattern and the top surface of the second fin-type active area FA2. Each of the plurality of second sub-gate portions 120S2 may be disposed in a corresponding space of spaces between the second fin-type active area FA2 and the lowermost second semiconductor pattern of the plurality of second semiconductor patterns NS2 and between two adjacent second semiconductor patterns of the plurality of second semiconductor patterns NS2.

The first main gate portion 120M1 of the first gate structure 120A may include a first work function control layer 122, a buried conductive layer 126, and a gate insulation layer 128. The second main gate portion 120M2 of the second gate structure 120B may include a second work function control layer 124, the second buried conductive layer 126, and the gate insulation layer 128. Each of the plurality of first sub-gate portions 120S1 may include the first work function control layer 122 and the gate insulation layer 128. Each of the plurality of second sub-gate portions 120S2 may include the second work function control layer 124 and the gate insulation layer 128.

The gate insulation layer 128 may be on the top surfaces of the first and second fin-type active areas FA1 and FA2, and may extend onto the element isolation layer 112 and the deep trench insulation layer 114. The gate insulation layer 128 may surround each of the plurality of first semiconductor patterns NS1, and may surround each of the plurality of second semiconductor patterns NS2.

The first work function control layer 122 may surround each of the plurality of first semiconductor patterns NS1, and may extend over the element isolation layer 112 and the deep trench insulation layer 114. The first work function control layer 122 may fill an inner space of the plurality of first sub-gate portions 120S1 with the gate insulation layer 128. The second work function control layer 124 may surround each of the plurality of second semiconductor patterns NS2 and may fill the inner space of the plurality of second sub-gate portions 120S2 with the gate insulation layer 128. The buried conductive layer 126 may be on the first work function control layer 122 and the second work function control layer 124, and may fill the inner spaces of the first and second main gate portions 120M1 and 120M2.

As illustrated in FIG. 3B, the gate insulation layer 128 may have a stacked structure of an interface layer 128I and a high-k dielectric layer 128H. The interface layer 128I may remove or cure a defect of an interface between the top surfaces of the first and second fin-type active areas FA1 and FA2, and the high-k dielectric layer 128H, on surfaces of the plurality of first and second semiconductor patterns NS1 and NS2.

In an embodiment, the interface layer 128I may include a layer of a low-k dielectric material having a dielectric constant of about 9 or less, for example, a silicon oxide layer, a silicon oxynitride layer, a Ga oxide layer, a Ge oxide layer, or a combination thereof. In an embodiment, the interface layer 128I may include a silicate, a combination of silicate and a silicon oxide layer, or a combination of a silicate and a silicon oxynitride layer. In an embodiment, the interface layer 128I may be omitted.

The high-k dielectric layer 128H may include a material having a dielectric constant greater than the silicon oxide layer. For example, the high-k dielectric layer 128H may have a dielectric constant of about 10 to about 25. The high-k dielectric layer 128H may include hafnium oxide, hafnium oxynitride, hafnium silicon oxide, lanthanum oxide, lanthanum aluminum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof. However, the material constituting the high-k dielectric layer 128H is not limited thereto. The high-k dielectric layer 128H may be formed by an atomic layer deposition (ALD) process, a chemical vapor deposition (CVD) process, or a physical vapor deposition (PVD) process. The high-k dielectric layer 128H may have a thickness of about 10 Å to about 40 Å, but is not limited thereto.

In example embodiments, the first work function control layer 122 and the second work function control layer 124 may include Al, Cu, Ti, Ta, W, Mo, TaN, NiSi, CoSi, TiN, TiAlC, TiAlN, TaCN, TaC, TaSiN, or a combination thereof, but the embodiments are not limited thereto. The second work function control layer 124 may include a double-layer structure of a lower second work function control layer 124L and an upper second work function control layer 124U. The upper second work function control layer 124U may include the same material as the first work function control layer 122, and may be formed by using the same forming process as that of first work function control layer 122. In some examples, the first work function control layer 122 may include TiN, the lower second work function control layer 124L may include TiN, and the upper second work function control layer 124U may include TiN. In an example embodiment, the upper second work function control layer 124U and the first work function control layer 122 may be formed of the same material as each other, such as Al, Cu, Ti, Ta, W, Mo, TaN, NiSi, CoSi, TiN, TiAlC, TiAlN, TaCN, TaC, TaSiN, or a combination thereof. In an example embodiment, the lower second work function control layer 124L, the upper second work function control layer 124U and the first work function control layer 122 may be formed of the same material as each other, such as Al, Cu, Ti, Ta, W, Mo, TaN, NiSi, CoSi, TiN, TiAlC, TiAlN, TaCN, TaC, TaSiN, or a combination thereof.

In example embodiments, the buried conductive layer 126 may include Al, Cu, Ti, Ta, W, Mo, TaN, NiSi, CoSi, TiN, WN, TiAl, TiAlC, TiAlN, TaCN, TaC, TaSiN, or a combination thereof. However, the embodiments are not limited thereto.

A thickness T21 of the first work function control layer 122 in the vertical direction (Z direction) may be less than a thickness T22 of the second work function control layer 124 in the vertical direction (Z direction). Accordingly, the second transistor TR2 may have a second threshold voltage that is different from a first threshold voltage of the first transistor TR1. In addition, the thickness T21 of the first work function control layer 122 in the vertical direction (Z direction) may be equal to a thickness T23 of the upper second work function control layer 124U in the vertical direction (Z direction).

As illustrated in FIG. 3A, the first work function control layer 122 may include a step portion 122P protruding downward toward the element isolation layer 112 at a location where the first work function control layer 122 overlaps the element isolation layer 112. For example, the step portion 122P may be positioned on the element isolation layer 112. The gate insulation layer 128 may have a recess region 128R at a location where the gate insulation layer 128 vertically overlaps the step portion 122P of the first work function control layer 122, and the recess region 128R may be in contact with the step portion 122P of the first work function control layer 122. For example, the gate insulation layer 128 may include a portion recessed toward the element isolation layer 112 such that the recessed portion (i.e., the recess region 128R) of the gate insulation layer 128 may receive the step portion 122P. The gate insulation layer 128 may be in contact with the entire bottom surface of the step portion 122P, and accordingly, the first work function control layer 122 or the step portion 122P of the first work function control layer 122 may not be in contact with the element isolation layer 112. In FIG. 3A, the recess region 128R of the gate insulation layer 128 is illustrated as being formed to have a relatively flat bottom level. However, unlike this case, the recess region 128R of the gate insulation layer 128 may be formed to have a sloped bottom level.

The recess region 128R of the gate insulation layer 128 may be a region which is formed, after the plurality of second semiconductor patterns NS2 are covered by the second mask pattern 240P (refer to FIG. 24B), by using an etching process for removing a preliminary work function control layer 122X (refer to FIG. 24B) between the plurality of first semiconductor patterns NS1 (for example, the preliminary work function control layer 122X in the sub-gate space GSS), and by using a removal process of the second mask pattern 240P.

For example, the step portion 122P of the first work function control layer 122 may include a first step and a second step. The second step may be farther from the plurality of first semiconductor patterns NS1 than the first step. The second step may be spaced apart from the plurality of first semiconductor patterns NS1 in the second direction (Y direction) by a second spacing distance S21, and the second step of the step portion 122P of the first work function control layer 122 may be spaced apart from an end portion 124_E of the second work function control layer 124 (or, an edge portion of the second work function control layer 124 on the element isolation layer 112) in the second direction (Y direction) by a third spacing distance S22. In addition, the plurality of first semiconductor patterns NS1 and the plurality of second semiconductor patterns NS2 may be apart from each other by a first spacing distance S11 (refer to FIG. 1). The second spacing distance S21 may be less than the first spacing distance S11.

In the example embodiments, the first spacing distance S11 may be in a range of about 50% to about 200% of the first width W11 of the plurality of first semiconductor patterns NS1 (for example, $\frac{1}{2}*W11 \leq S11 \leq 2*W11$) in the second direction (Y direction), and the second spacing distance S21 may be in a range of about 10% to about 100% of the first width W11 (for example, $\frac{1}{10}*W11 \leq S21 \leq W11$). The term of "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

For example, when the first spacing distance S11 is less than about 50% of the first width W11 of the plurality of first semiconductor patterns NS1, the preliminary work function control layer 122X (refer to FIG. 21B) formed between the first semiconductor patterns NS1 may not be completely removed. When the first spacing distance S11 is greater than about 200% of the first width W11 of the plurality of first semiconductor patterns NS1, it may be unnecessary to perform the two etching processes used for the first mask pattern 230P and the second mask pattern 240P, which are described later with reference to FIGS. 7A through 25B.

When the first spacing distance S11 is in the range of about 50% to about 200% of the first width W11 of the plurality of first semiconductor patterns NS1 in the second direction (Y direction), the step portion 122P may be formed in the first work function control layer 122 by performing the two etching processes used for the first mask pattern 230P and the second mask pattern 240P. As the edge of the second mask pattern 240P and the end portion 124_E of the second work function control layer 124 are spaced apart from each other, for example, by the spacing distance corresponding to the second spacing distance S21 in the range of about 10% to about 100% of the first width W11 of the plurality of first semiconductor patterns NS1, precision of a removal process of the preliminary work function control layer 122X may be increased.

Gate spacers 132 may be arranged on opposite sidewalls of the gate structure 120. The gate spacers 132 may include silicon nitride or silicon oxynitride. Although not illustrated, the gate spacers 132 may have a multi-layer structure including a plurality of material layers sequentially formed on opposite sidewalls of the gate structure 120.

A first recess RS1 may be formed in the first fin-type active area FA1. The first recess RS1 may be formed on both sides of a region of the first fin-type active area FA1 on which the plurality of first semiconductor patterns NS1 are disposed, and the first semiconductor layer 142 may fill the inside of the first recess RS1. The first semiconductor layer 142 may be connected to an end of each of the plurality of first semiconductor patterns NS1. The first semiconductor layer 142 may be grown from the first fin-type active area FA1 and the plurality of first semiconductor patterns NS1 by a selective epitaxial growth (SEG) process. In addition, a second recess RS2 may be formed in the second fin-type active area FA2. The second recess RS2 may be formed on opposite sides of a region of the second fin-type active area FA2 on which the plurality of second semiconductor patterns NS2 are disposed, and the second semiconductor layer 144 may fill the inside of the second recess RS2. The first semiconductor layer 142 and the second semiconductor layer 144 may include an epitaxially grown Si layer, an epitaxially grown SiC layer, an embedded SiGe structure including a plurality of epitaxially grown SiGe layers, etc.

Inner spacers 134 may be between the first semiconductor layer 142 and the gate structure 120, and between the second semiconductor layer 144 and the gate structure 120. Each of the inner spacers 134 may be between the first semiconductor layer 142 and the gate insulation layer 128 in a corresponding one of the plurality of first sub-gate portions 120S1, and between the second semiconductor layer 144 and the gate insulation layer 128 in a corresponding one of the plurality of second sub-gate portions 120S2. The inner spacers 134 may include silicon nitride or silicon oxynitride.

A gate insulation liner 152 and an inter-gate insulation layer 154 may be sequentially formed on opposite sidewalls of the gate spacer 132, on the first semiconductor layer 142, and on the second semiconductor layer 144. A first top insulation layer 162 and a second top insulation layer 164 may be sequentially arranged on the gate structure 120. A contact plug 166 may be in a contact hole 166H that exposes the top surfaces of the first semiconductor layer 142 and the second semiconductor layer 144 by passing through the first top insulation layer 162, and a metal silicide layer 168 may be further formed between the contact plug 166 and the first semiconductor layer 142, and between the contact plug 166 and the second semiconductor layer 144. The metal silicide layer 168 may include titanium silicide or cobalt silicide, but is not limited thereto.

A first wiring layer 172 may be connected to the contact plug 166, and the second wiring layer 174 may be connected to the gate structure 120. For example, the first wiring layer 172 may be in a first via hole 172H passing through the second top insulating layer 164, and a first barrier layer 172B may be further formed on the inner wall of the first via hole 172H. The second wiring layer 174 may be in a second via hole 174H passing through the first and second top insulation layers 162 and 164, and a second barrier layer 174B may be further formed on the inner wall of the second via hole 174H.

In general, to provide the first transistor TR1 and the second transistor TR2 constituted by the same gate layer structure (e.g., having the same types and arrangement of layers) with different threshold voltages from each other, after the preliminary work function control layer 122X (refer to FIG. 21B) is formed, a method of selectively removing only the preliminary work function control layer 122X from a first transistor forming region may be used. However, in an integrated circuit device including a plurality of semiconductor patterns of a nanosheet type, a level of difficulty may be relatively high in a process of removing selectively the preliminary work function control layer 122X in a space between each of the plurality of semiconductor patterns (for example, the sub-gate space GSS (refer to FIG. 21B)). Particularly, when the first width W11 of the plurality of first semiconductor patterns NS1 is relatively large and the first spacing distance S11 between the plurality of first semiconductor patterns NS1 is relatively small, the preliminary work function control layer 122X in the sub-gate space GSS may not be completely removed, and/or an unwanted etching may occur in the preliminary work function control layer 122X in a second transistor forming region. In this case, a precise control of the threshold voltage of the integrated circuit device 100 may be difficult.

However, in the method of manufacturing the integrated circuit device 100 according to the above-described example embodiments, a first mask pattern 230P (refer to FIG. 21B) may be used to remove first only the portion of the preliminary work function control layer 122X on the top surface and the side wall of the plurality of first semiconductor patterns NS1, and thereafter, a second mask pattern 240P (refer to FIG. 23B) may be used as an etching mask to remove the portion of the preliminary work function control layer 122X filling a space between each of the plurality of first semiconductor patterns NS1 (that is, the portion of the preliminary work function control layer 122X in the sub-gate space GSS). Since the second mask pattern 240P completely covers the portion of the preliminary work function control layer 122X in the second transistor forming region, unwanted etching of the preliminary work function control layer 122X in the second transistor forming region may be prevented, while it is possible to completely remove the portion of the preliminary work function control layer 122X in the sub-gate space GSS in the first transistor forming region. Thus, a precise control of the threshold voltage of the integrated circuit device 100 may be possible.

Figure 4:
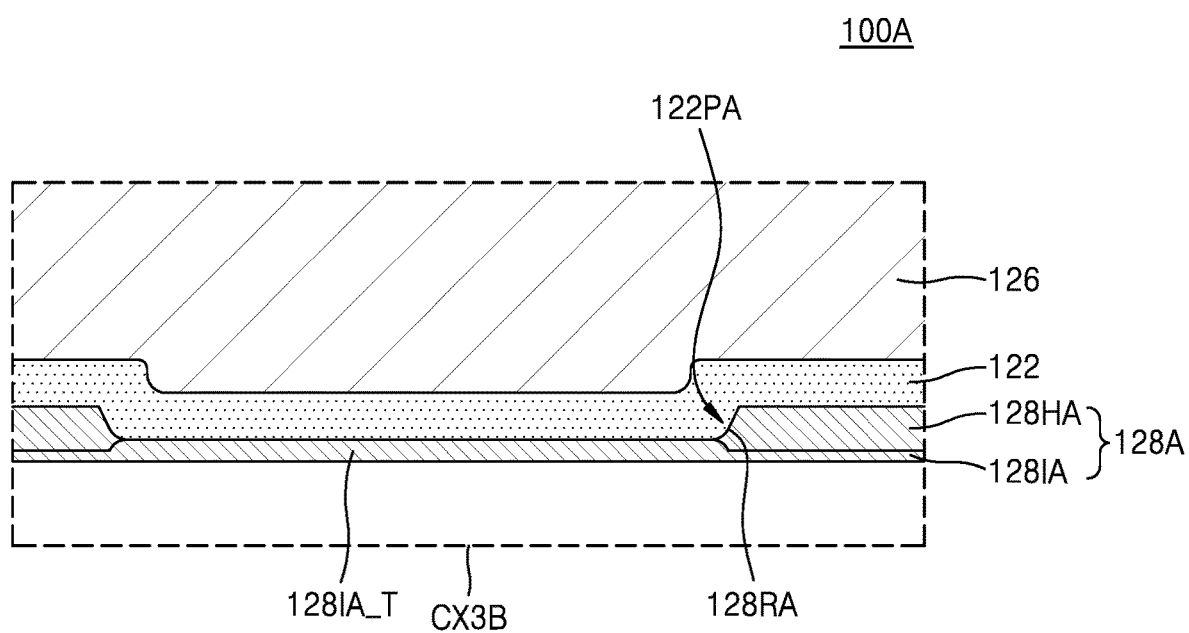
FIG. 4 is a cross-sectional view of an integrated circuit device according to example embodiments.

FIG. 4 is a cross-sectional view of an integrated circuit device 100A according to example embodiments. FIG. 4 is a cross-sectional view of a portion corresponding to a region CX3B in FIG. 3A.

Referring to FIG. 4, the gate insulation layer 128A may include an interface layer 128IA and a high-k dielectric layer 128HA, and the stepped portion 122PA of the first work function control layer 122 may pass through the high-k dielectric layer 128HA to be in contact with the interface layer 128IA. The term "contact," or "in contact with," as used herein, refers to a direction connection (i.e., touching) unless the context indicates otherwise. A protrusion 128IA_T of the interface layer 128IA may be formed at a position where the high-k dielectric layer 128HA is removed. The protrusion portion 128IA_T of the interface layer 128IA may be in contact with the stepped portion 122PA of the first work function control layer 122, and the high-k dielectric layer 128HA may surround the stepped portion 122PA of the first work function control layer 122. A level of a top surface of the protrusion portion 128IA_T may be higher than a level of a top surface of the interface layer 128IA on the first fin-type active area FA1 (refer to FIG. 2B).

In example embodiments, in a wet etching process using the second mask pattern 240P (refer to FIG. 24B) and/or in a removing process of the second mask pattern 240P, a portion of the gate insulation layer 128A that is on the element isolation layer 112 and exposed to an etching atmosphere, that is, the portion of the high-k dielectric layer 128HA, may be removed together to form a recess region 128RA in the gate insulation layer 128A. However, in the wet etching process, additional oxidation of the interface layer 128IA may occur as the portion of the high-k dielectric layer 128HA is removed and the interface layer 128IA under the high-k dielectric layer 128HA is exposed, and accordingly, the protrusion portion 128IA_T may be formed on an exposed portion of the interface layer 128IA.

Figure 5:
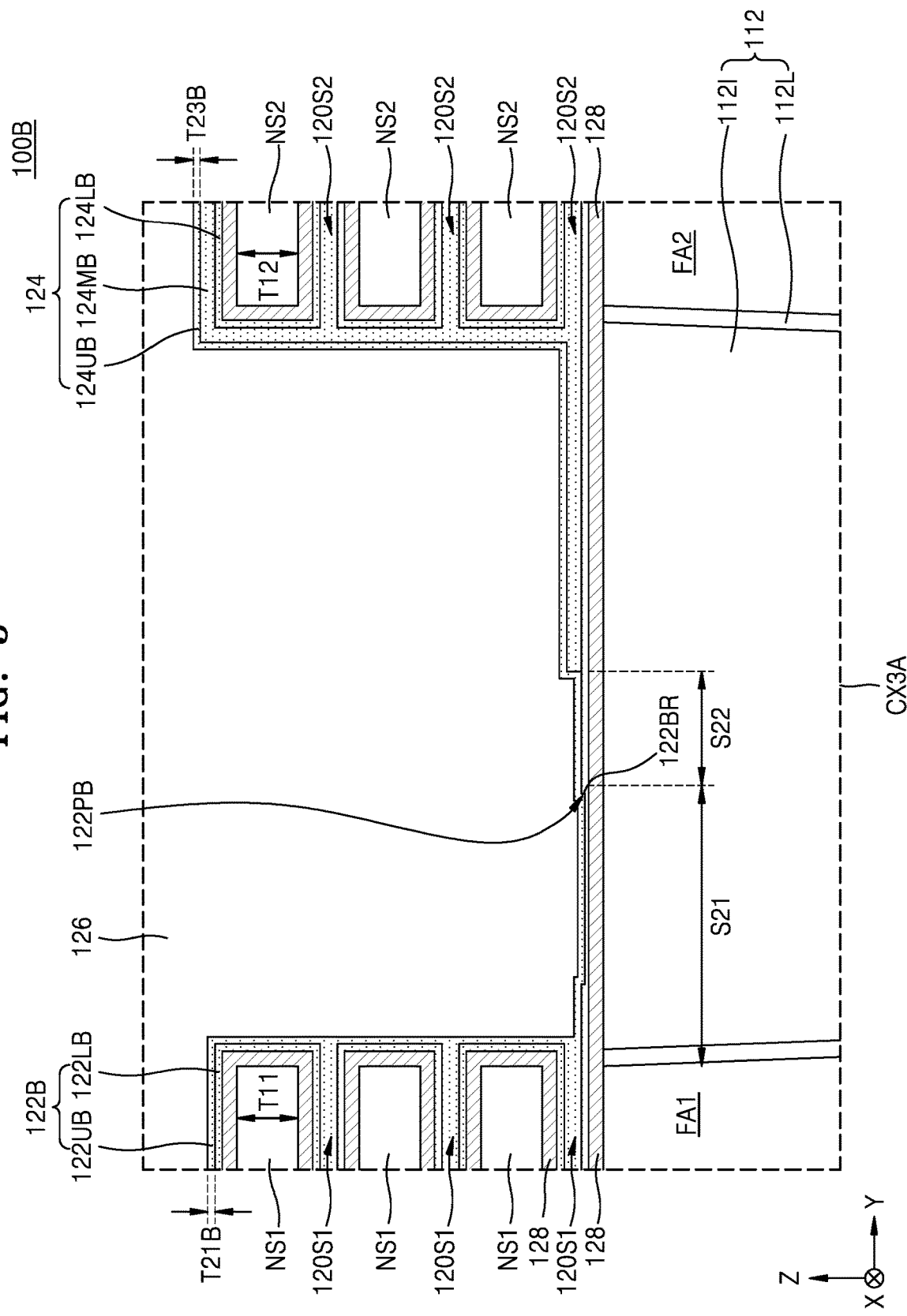
FIG. 5 is a cross-sectional view of an integrated circuit device according to example embodiments.

FIG. 5 is a cross-sectional view of an integrated circuit device 100B according to an embodiment. FIG. 5 is a cross-sectional view of a portion corresponding to the region CX3A in FIG. 2B.

Referring to FIG. 5, a first work function control layer 122B may include a lower first work function control layer 122LB and an upper first work function control layer 122UB. In some embodiments, the lower first work function control layer 122LB may include TaN, and the upper first work function control layer 122UB may include TiN.

A second work function control layer 124B may include a lower second work function control layer 124LB, an intermediate second work function control layer 124MB, and an upper second work function control layer 124UB. In some embodiments, the lower second work function control layer 124LB may include TaN, the intermediate second work function control layer 124MB may include TiN, and the upper second work function control layer 124UB may include TiN.

For example, after a preliminary work function control layer (not shown) including the lower second work function control layer 124LB and the intermediate second work function control layer 124MB is first formed, the intermediate second work function control layer 124MB may be selectively removed from the first fin-type active area FA1. The removal process may be a wet etching process using etching selectivity of the intermediate second work function control layer 124MB with reference to the lower second work function control layer 124LB, and in this case, a portion of the lower second work function control layer 124LB may be removed together with the intermediate second work function control layer 124MB, and a recess region 122BR may be formed in the lower second work function control layer 124LB. Thereafter, the upper second work function control layer 124UB may be formed on the lower second work function control layer 124LB.

Material layers formed in the same process for the lower second work function control layer 124LB and the upper second work function control layer 124UB may remain in the first fin-type active area FA1, and each of the material layers may be referred to as the lower first work function control layer 122LB and the upper first work function control layer 122UB. Accordingly, a thickness T23B of the upper second work function control layer 124UB may be equal to a thickness T21B of the upper first work function control layer 122UB. In addition, the upper first work function control layer 122UB may include a step portion 122PB at a portion where the upper first work function control layer 122UB is in contact with the recess region 122BR.

Figure 6:
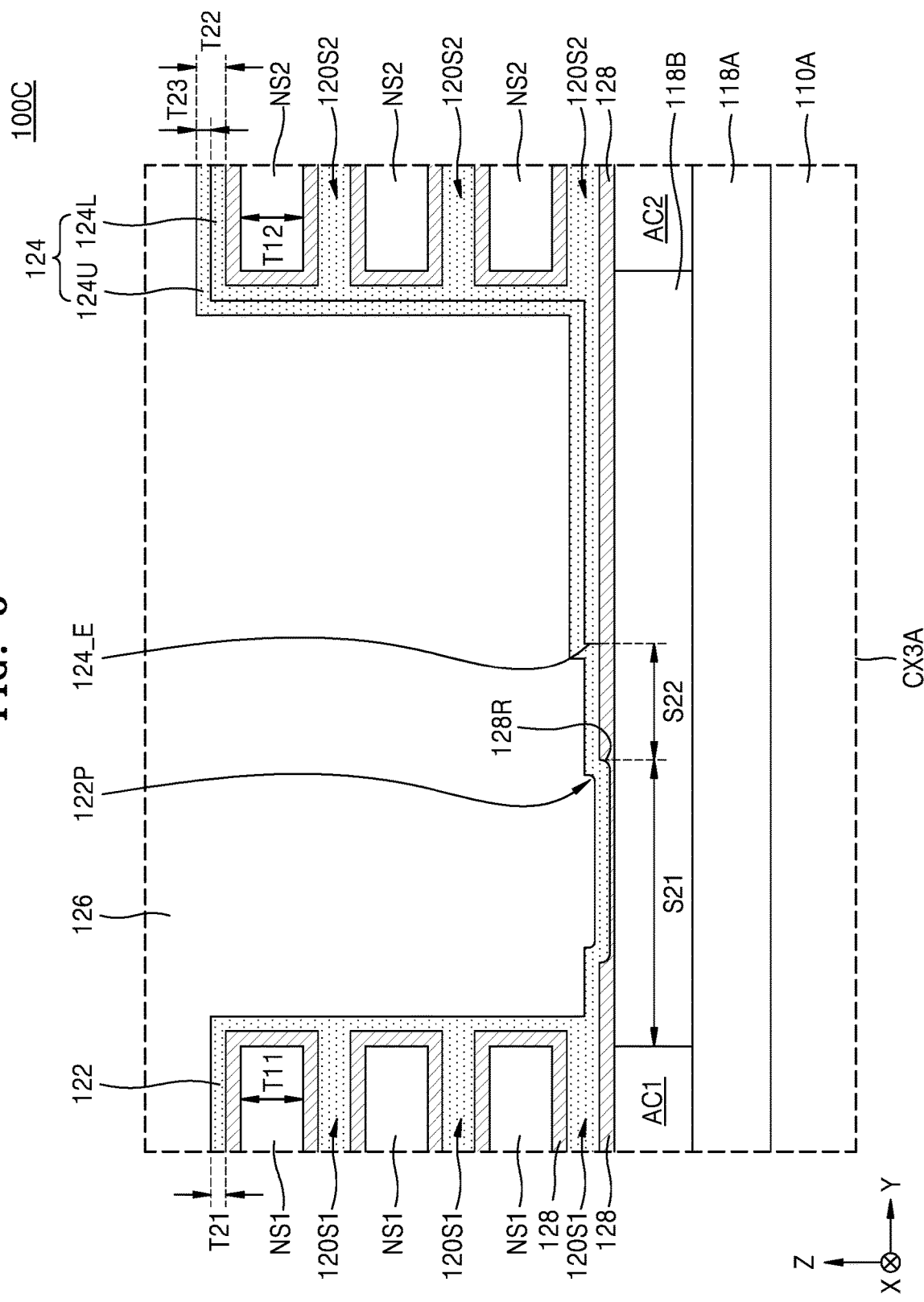
FIG. 6 is a cross-sectional view of an integrated circuit device according to example embodiments.

FIG. 6 is a cross-sectional view of an integrated circuit device 100C according to an embodiment. FIG. 6 is a cross-sectional view of a portion corresponding to the region CX3A in FIG. 2B.

Referring to FIG. 6, a buried insulation layer 118A may be on a substrate 110A, and a first active area AC1 and a second active area AC2 may be on the buried insulation layer 118A. An element isolation layer 118B may be between the first active area AC1 and the second active area AC2. The first active area AC1 and the second active area AC2 may include the same material as the substrate 110A. The present invention, however, is not limited thereto. In an example embodiment, the first active area AC1 and the second active area AC2 may include a different material from the substrate 110A. The first active area AC1 and the second active area AC2 may be a part of an epitaxial semiconductor layer on the substrate 110A and the buried insulation layer 118A, and the substrate 110A may be a substrate of an insulator (SOI) type.

FIGS. 7A through 25B are cross-sectional views illustrating a method of manufacturing the integrated circuit device 100 according to example embodiments. FIGS. 7A, 8A, 11A, 12 through 15, 16A, 17A, 18A, 19A, 20A, 21A, 22A, 23A, 24A, and 25A illustrate cross-sections taken along line A1-A1' and line A2-A2' in FIG. 1 according to the process sequence, and FIGS. 7B, 8B, 9, 10, 11B, 16B, 17B, 18B, 19B, 20B, 21B, 22B, 23B, 24B, and 25B illustrate cross-sections taken along line B1-B1' in FIG. 1 according to the process sequence.

Figure 7B:
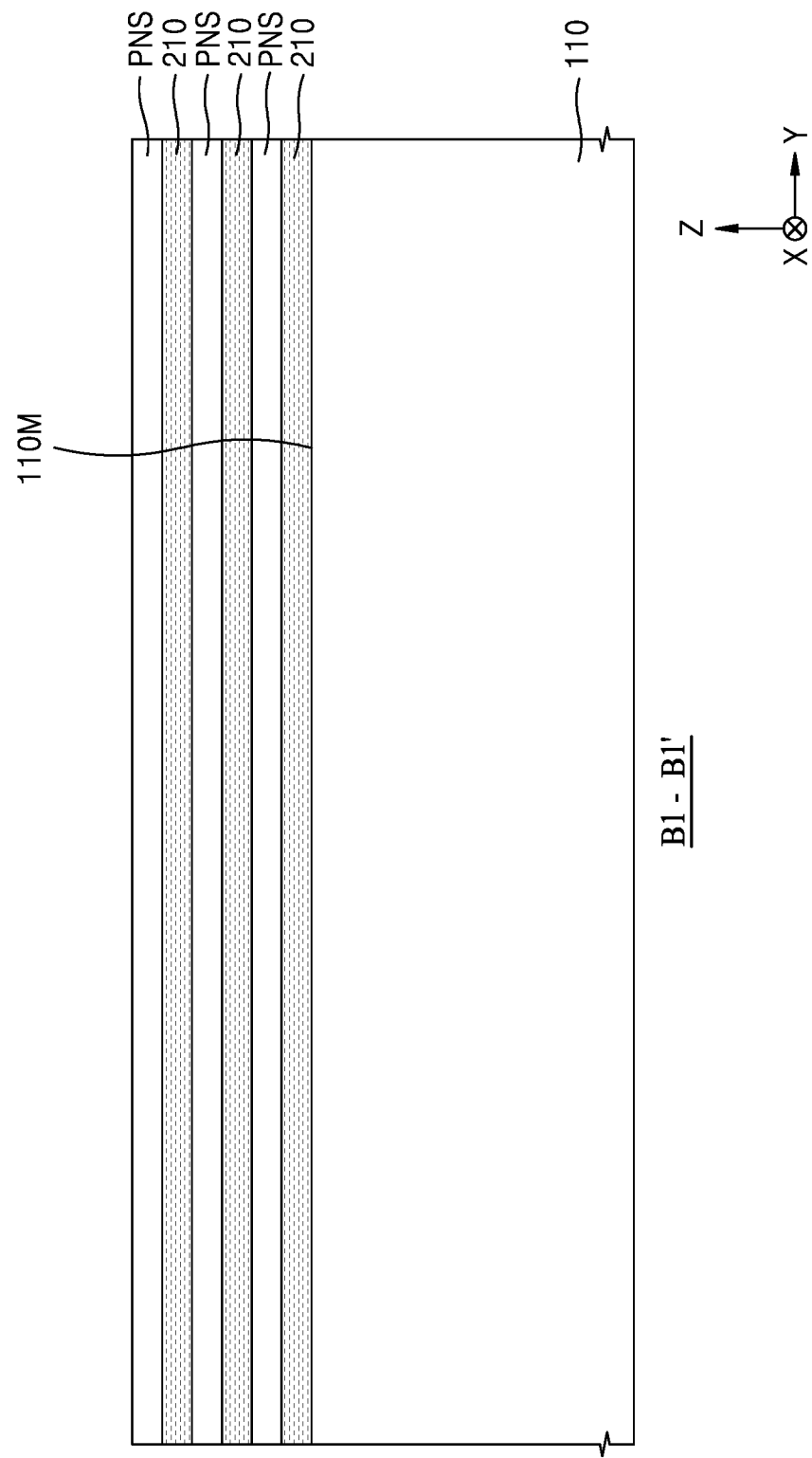

Referring to FIGS. 7A and 7B, a sacrifice layer structure 210S may be formed by alternately and sequentially forming a sacrificial layer 210 and a channel semiconductor layer PNS on a top surface 110M of a substrate 110. The sacrificial layer 210 and the channel semiconductor layer PNS may be formed by an epitaxy process.

In example embodiments, the sacrificial layer 210 and the channel semiconductor layer PNS may include materials having different etch selectivity from each other. For example, each of the sacrificial layer 210 and the channel semiconductor layer PNS may include a single crystal layer of a Group IV semiconductor, a single crystal layer of a Group IV-IV compound semiconductor or a single crystal layer of a Group III-V compound semiconductor, or may include a different material from each other. In an example, the sacrificial layer 210 may include SiGe, and the channel semiconductor layer PNS may include mono-crystalline silicon.

In example embodiments, the epitaxy process may include a chemical vapor deposition (CVD) process such as a vapor-phase epitaxy (VPE) process and an ultra-high vacuum chemical vapor deposition (UHV-CVD) process, a molecular beam epitaxy process, or a combination thereof. In the epitaxy process, a liquid or gaseous precursor may be used as a precursor required for forming the sacrificial layer 210 and the channel semiconductor layer PNS.

Figure 8B:
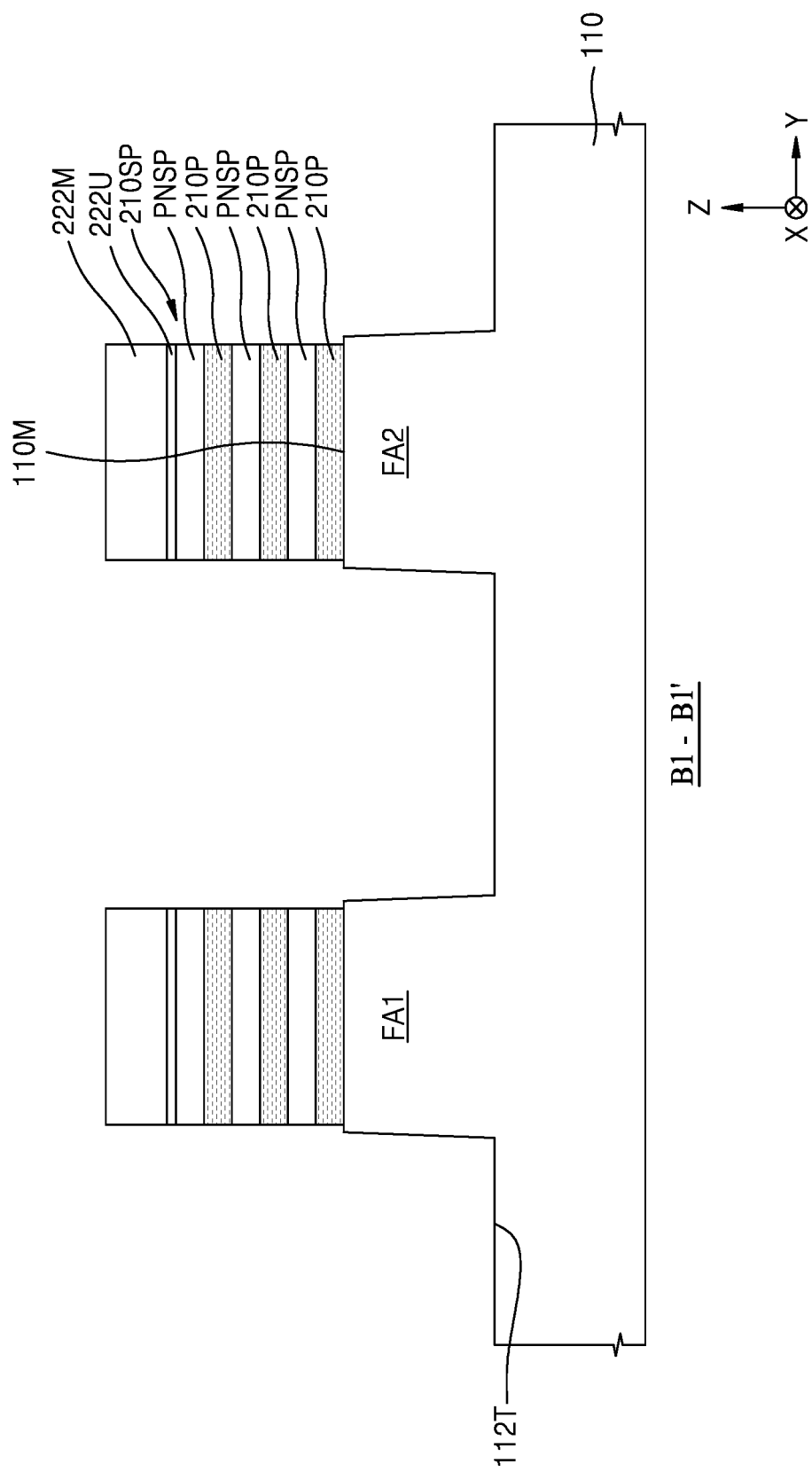

Referring to FIGS. 8A and 8B, after a lower layer 222U and a hardmask pattern 222M extending in a first direction (X direction) by a certain length are formed on the channel semiconductor layer PNS, a sacrifice pattern structure 210SP and an element isolation trench 112T may be formed by etching the sacrificial layer 210, the channel semiconductor layer PNS, and the substrate 110 by using the lower layer 222U and the hardmask pattern 222M as etching masks. The sacrifice pattern structure 210SP may include a sacrificial layer pattern 210P and a channel semiconductor layer pattern PNSP formed by etching the sacrificial layer 210 and the channel semiconductor layer PNS.

Figure 9:
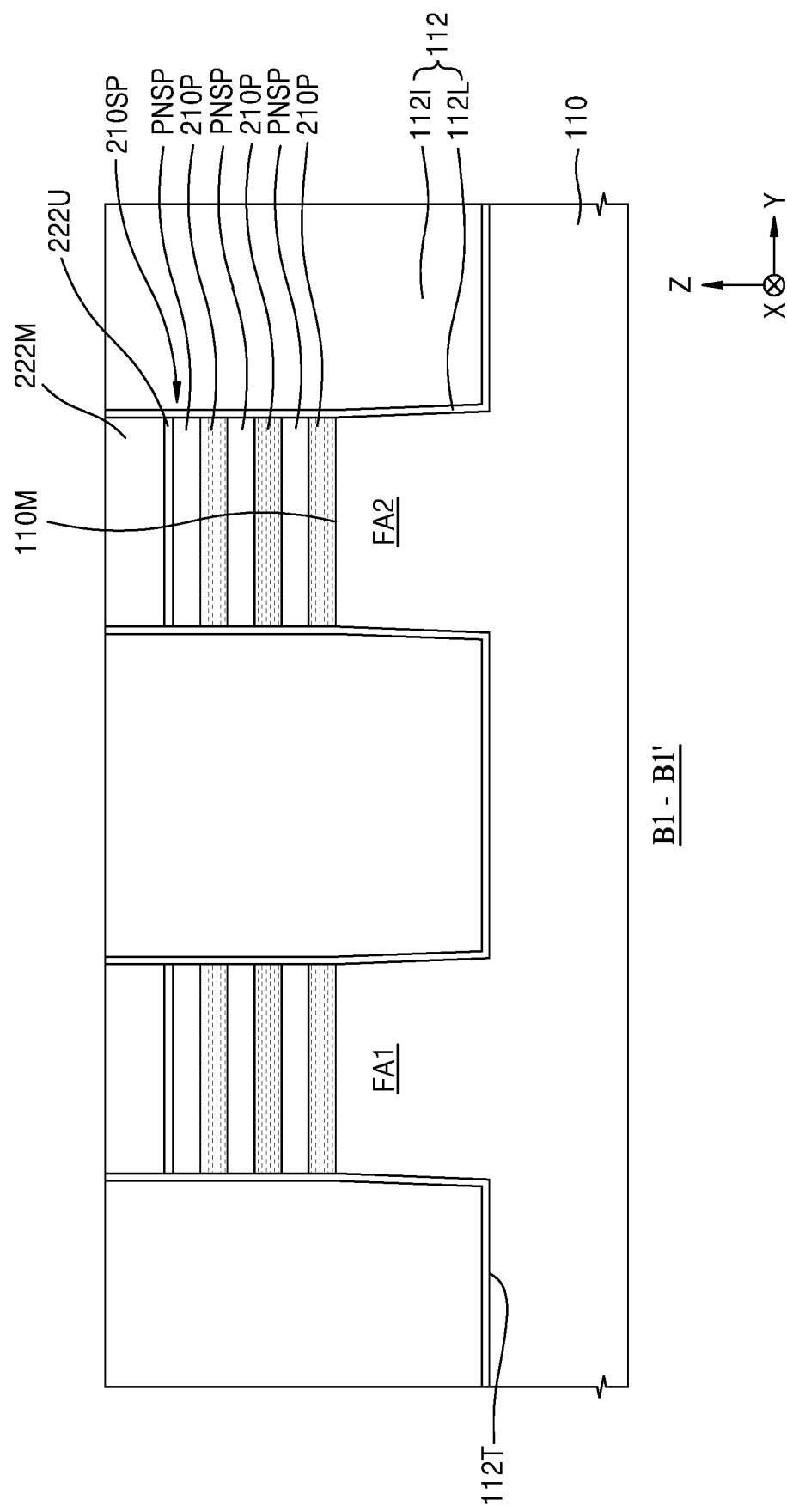

Referring to FIG. 9, an element isolation layer 112 may be formed to fill the element isolation trench 112T. In an example embodiment, an element isolation liner 112L may be formed conformally in the element isolation trench 112T, a gap fill isolation layer 112I may be formed on the element isolation liner 112L to fill the element isolation trench 112T, and a top portion of the gap fill isolation layer 112I may be planarized, and then the element isolation layer 112 filling the element isolation trench 112T may be formed.

Figure 10:
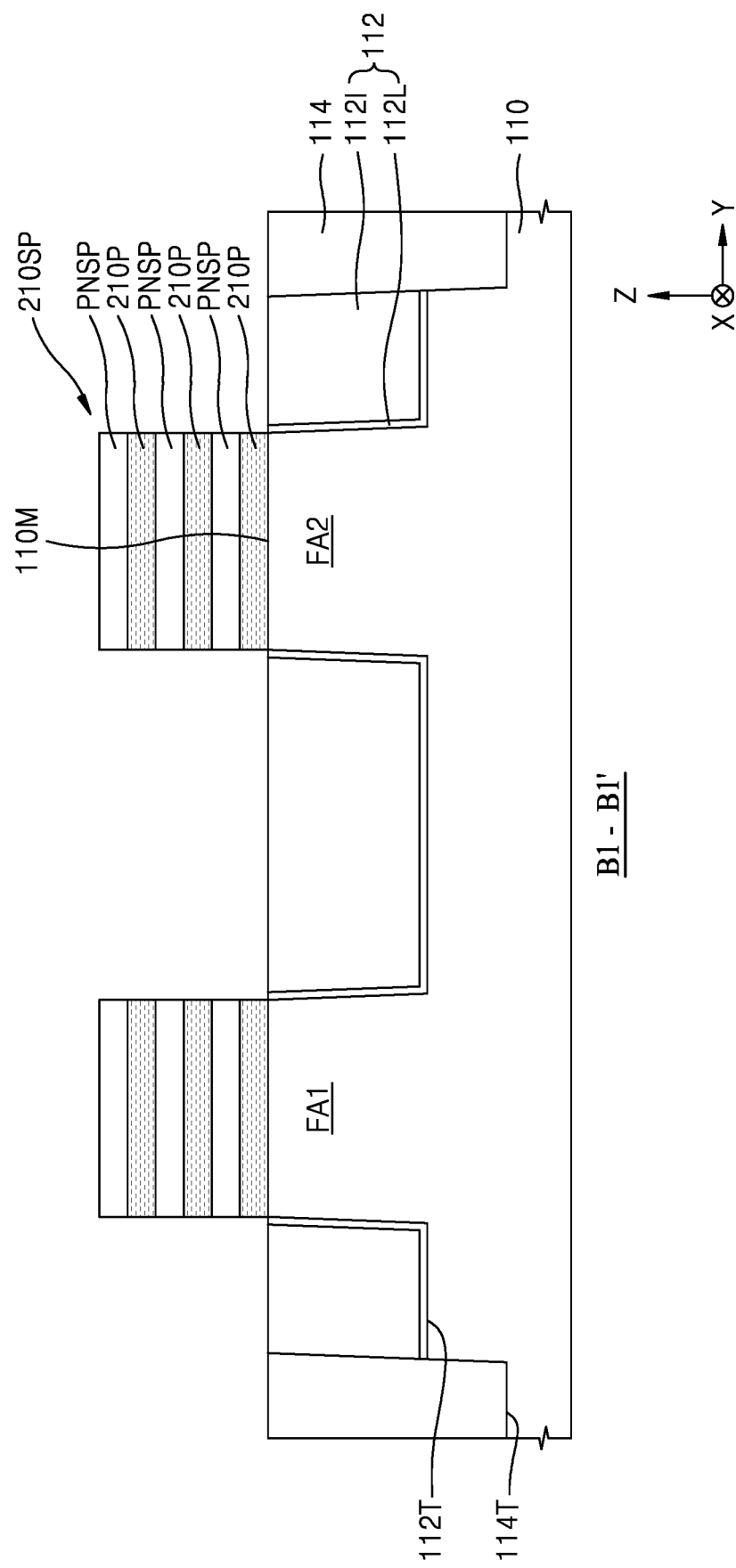

Referring to FIG. 10, a deep trench 114T defining the element region DR may be formed by etching portions of the element isolation layer 112 and the substrate 110, and a deep trench insulation layer 114 may be formed in the deep trench 114T.

Thereafter, the lower layer 222U and the hardmask pattern 222M remaining on the sacrifice pattern structure 210SP may be removed, and a recess process may be performed for removing top portions of the element isolation layer 112 and the deep trench insulation layer 114 by a certain thickness.

Figure 11A:
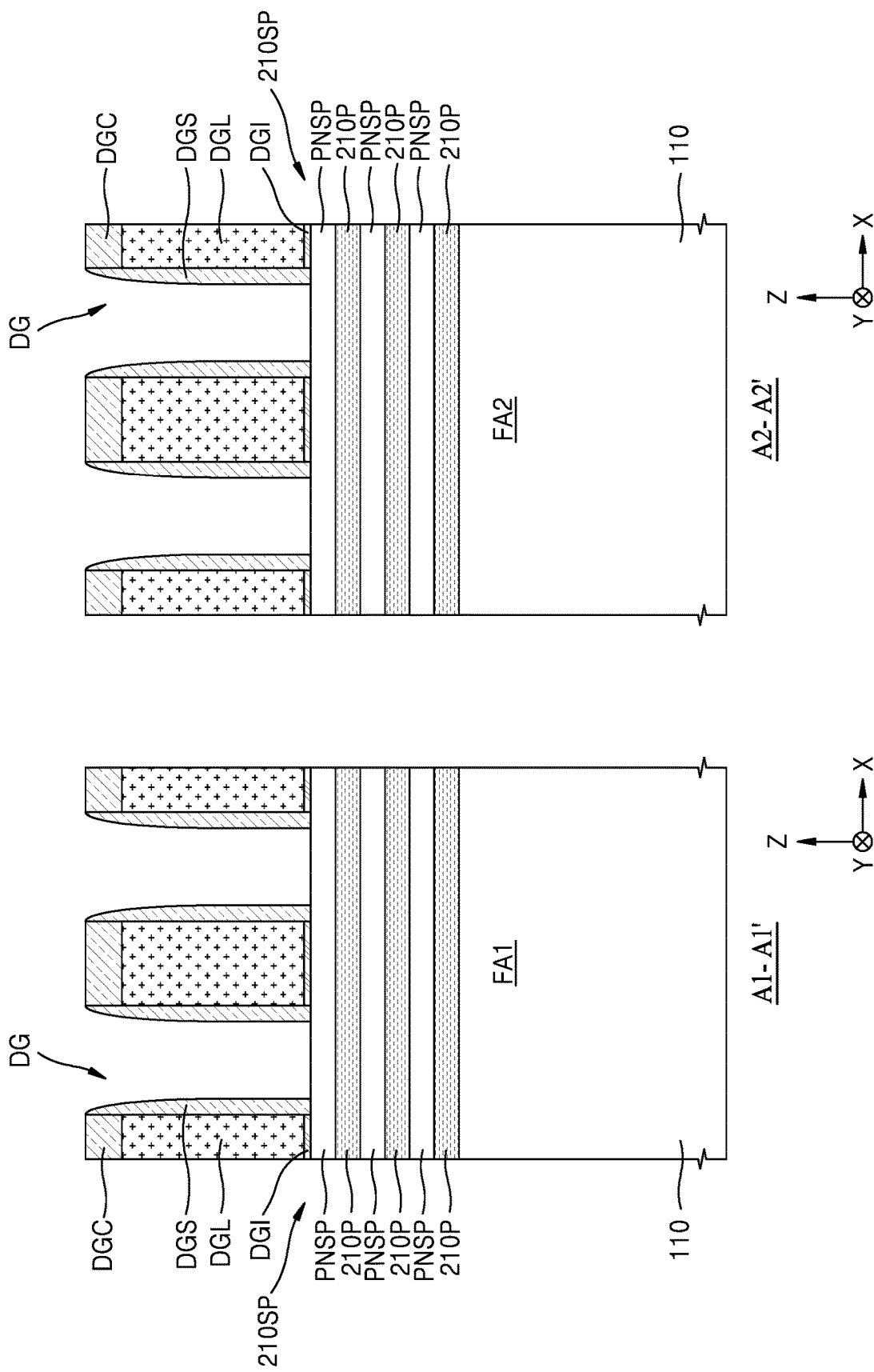
Figure 11B:
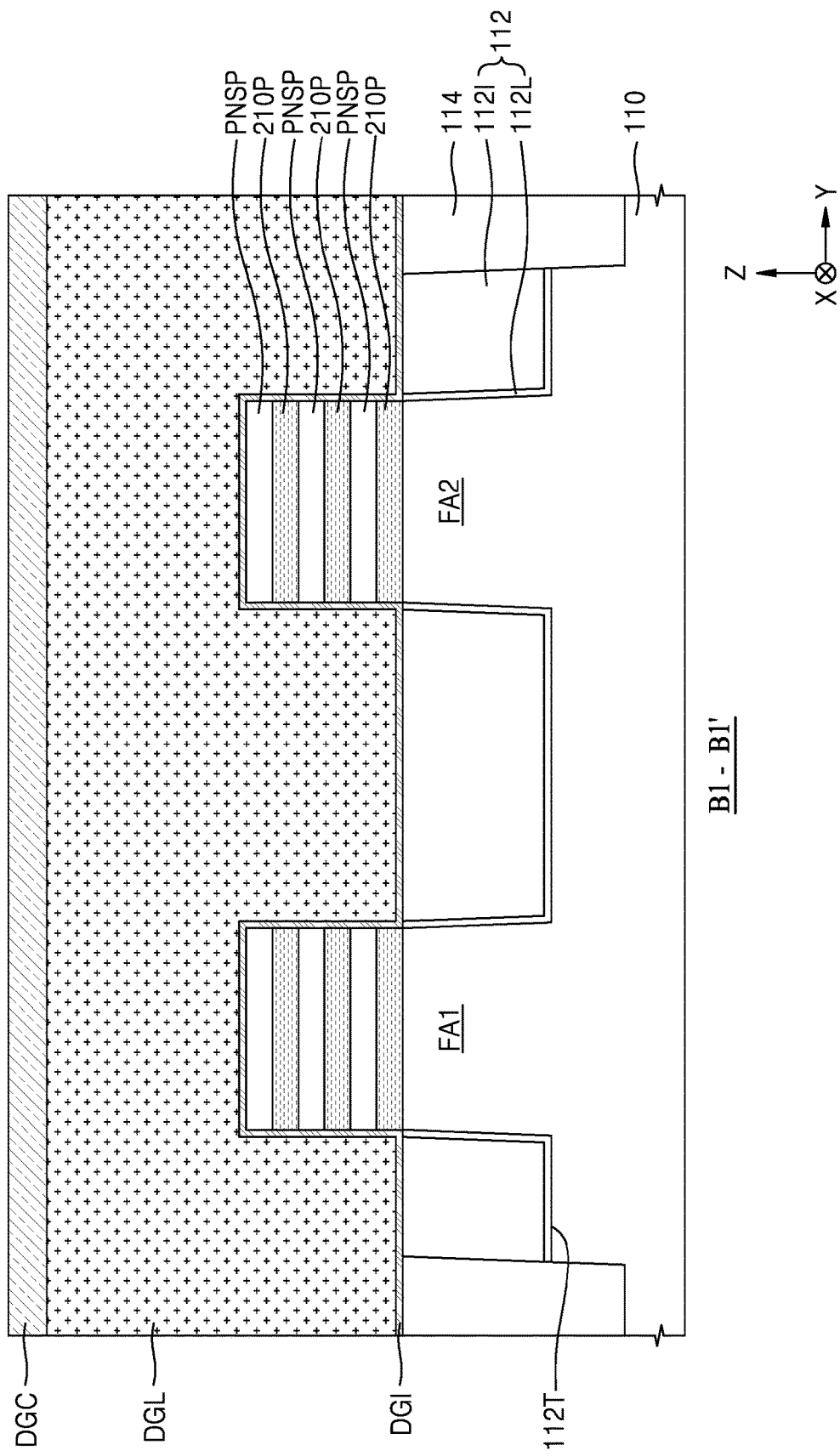

Referring to FIGS. 11A and 11B, a dummy gate structure DG may be formed on the sacrifice pattern structure 210SP (refer to FIG. 9) and the element isolation layer 112. The dummy gate structure DG may include a dummy gate insulation layer DGI, a dummy gate line DGL, a dummy gate capping layer DGC, and a dummy gate spacer DGS.

For example, the dummy gate line DGL may include polysilicon, and the dummy gate capping layer DGC may include a silicon nitride layer. The dummy gate insulation layer DGI may include a material having etch selectivity with respect to the dummy gate line DGL, and may include at least one layer of, for example, thermal oxide, silicon oxide, and silicon nitride. The dummy gate spacer DGS may include silicon oxide, silicon oxynitride, or silicon nitride, but the embodiment is not limited thereto.

Figure 12:
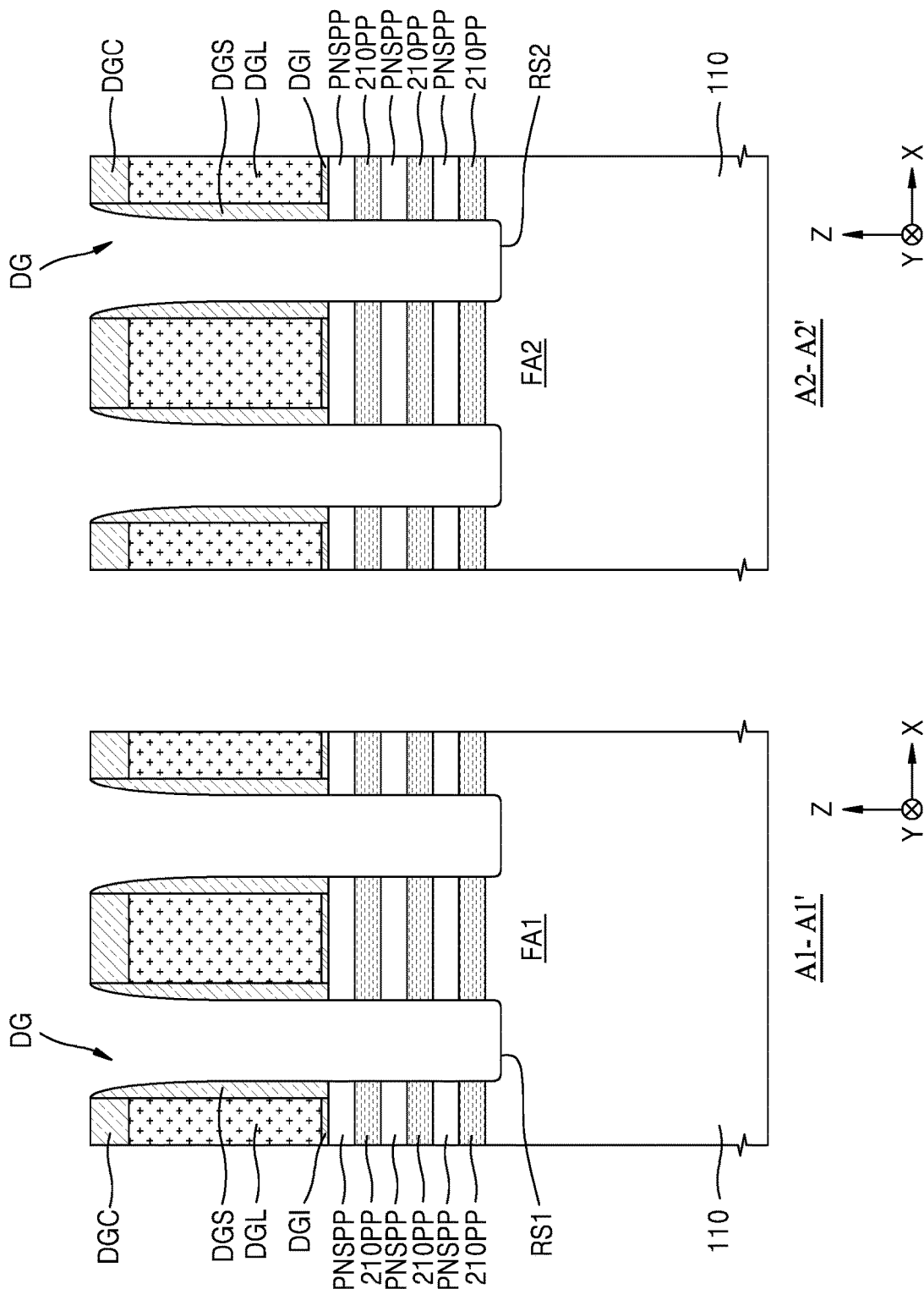

Referring to FIG. 12, a first recess RS1 and a second recess RS2 may be formed by etching portions of the sacrifice pattern structure 210SP and the substrate 110 using the dummy gate structure DG as an etching mask. The sacrificial layer pattern 210P and the channel semiconductor layer pattern PNSP may be further patterned to form a sacrificial pattern 210PP and a channel semiconductor pattern PNSPP. Side walls of the sacrificial pattern 210PP and the channel semiconductor pattern PNSPP may be exposed on the inner walls of the first and second recesses RS1 and RS2.

Figure 13:
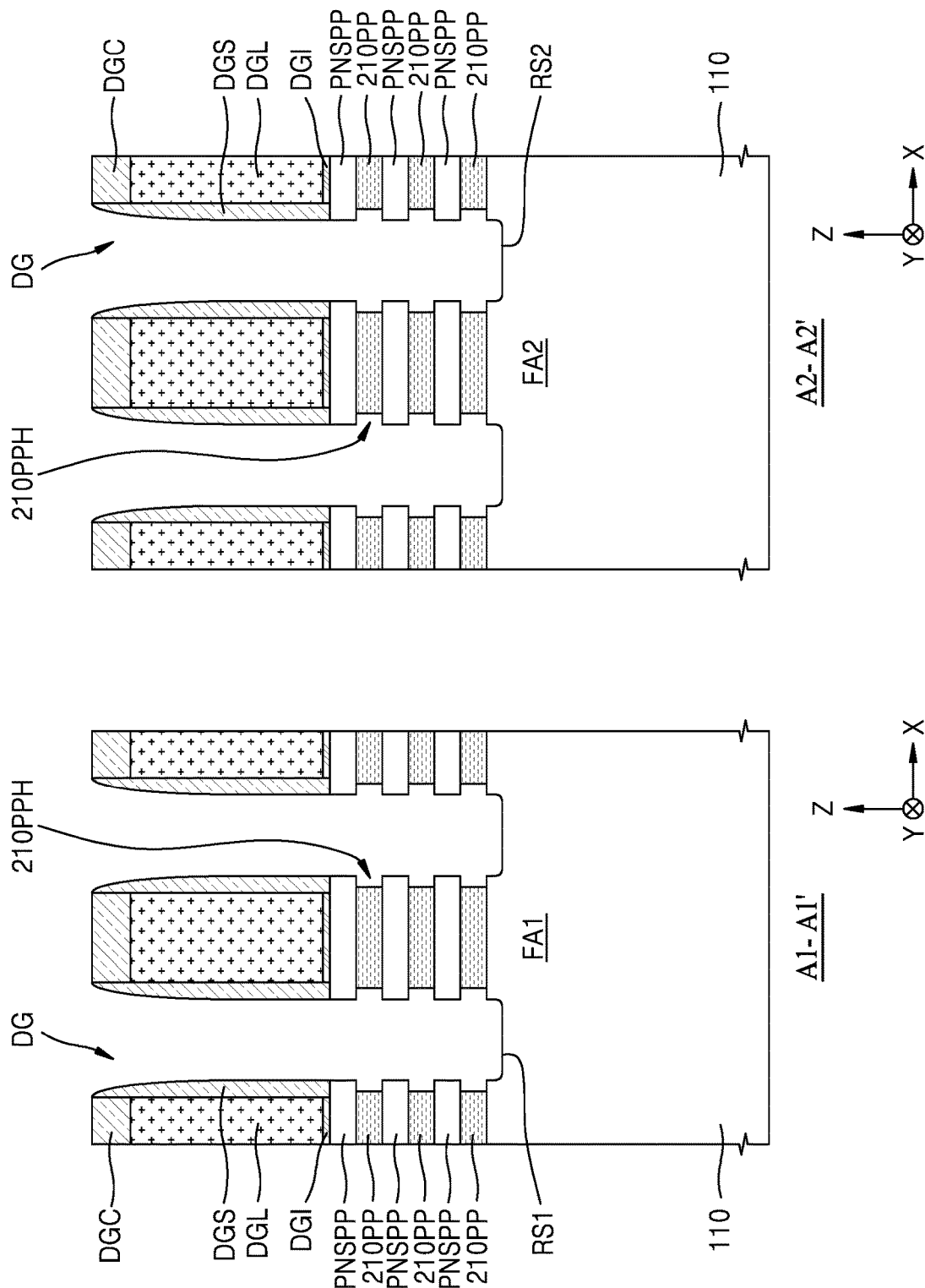

Referring to FIG. 13, a recess region 210H may be formed between two adjacent channel semiconductor patterns PNSPP by removing a portion of the sacrificial pattern 210PP exposed inside the first recess RS1 and the second recess RS2 by using an isotropic etching process. In an example embodiment, the recess region 210H may be formed by recessing the inner walls of the first and second recesses RS1 and RS2 in the first direction using an isotropic etching process. For example, the recess region 210H may be formed between two adjacent channel semiconductor patterns PNSPP stacked vertically on each other by removing a portion of the sacrificial pattern 210PP interposed therebetween. The portion of the sacrificial pattern 210PP may be exposed inside the first recess RS1 and the second recess RS2, and may be etched by performing the isotropic etching process using the channel semiconductor pattern PNSPP as an etching mask. In example embodiments, the recess region 210H may be formed by performing a wet etching process, as an example embodiment of the isotropic etching process, with etching selectivity of the sacrificial pattern 210PP with respect to the channel semiconductor pattern PNSPP. In the wet etching process, for example, the sacrificial pattern 210PP including SiGe may be etched faster than the channel semiconductor pattern PNSPP including, for example, Si, and accordingly, the recess region 210H may be formed.

Figure 14:
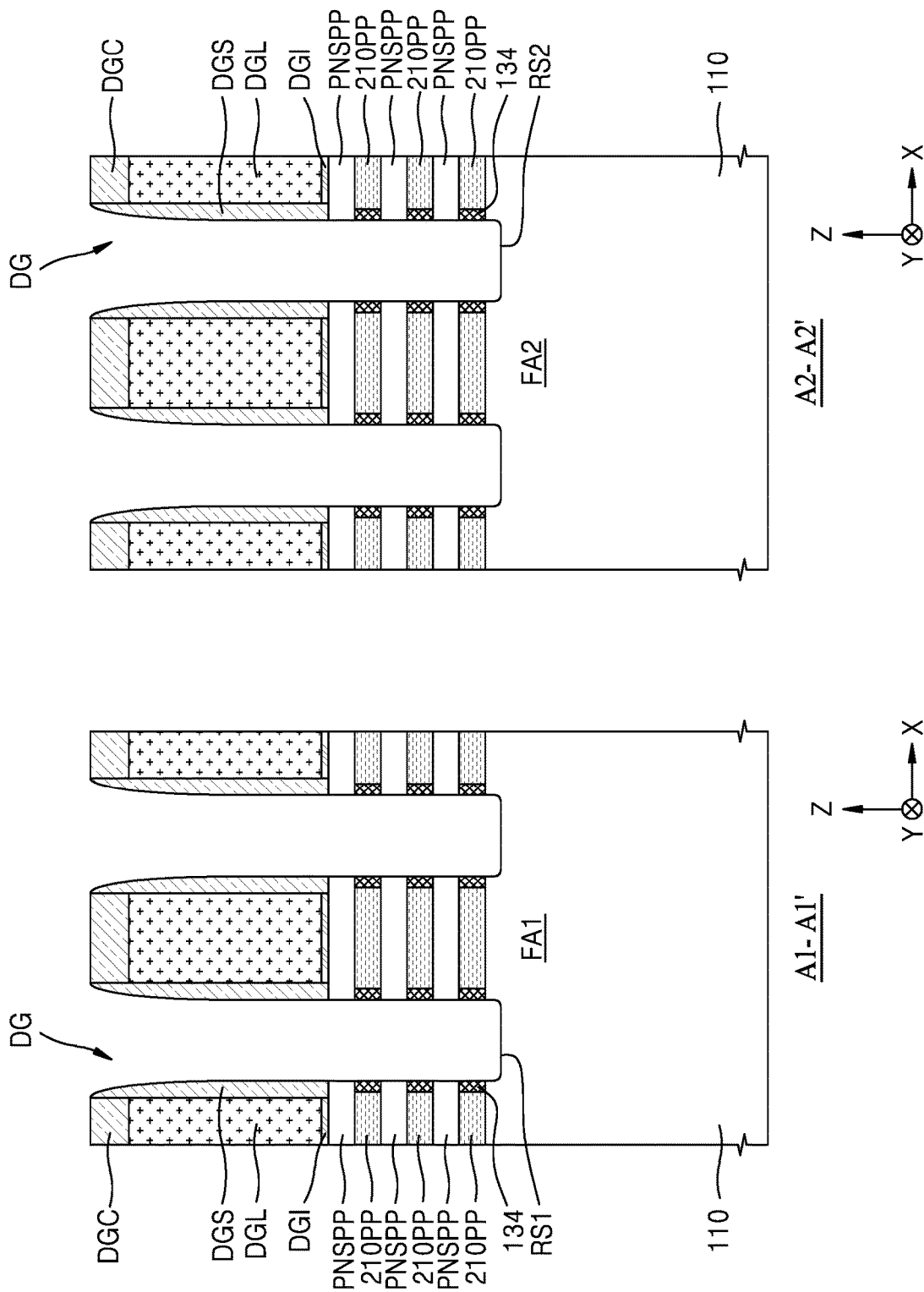

Referring to FIG. 14, an inner spacer 134 filling the recess region 210H exposed to the inner walls of the first and second recesses RS1 and RS2 may be formed. The inner spacer 134 may be formed by forming an insulation layer (not shown) on the dummy gate structure DG and on the inner walls of the first and second recesses RS1 and RS2 with the recess region 210H to fill the inside of the recess region 210H, and then removing the insulation layer (not shown) on outer walls of the dummy gate structure DG and the inner walls of the first and second recesses RS1 and RS2. In an example embodiment, the removing of the insulation layer may be performed using a directional etching process such as a reactive ion etching (RIE) process.

Figure 15:
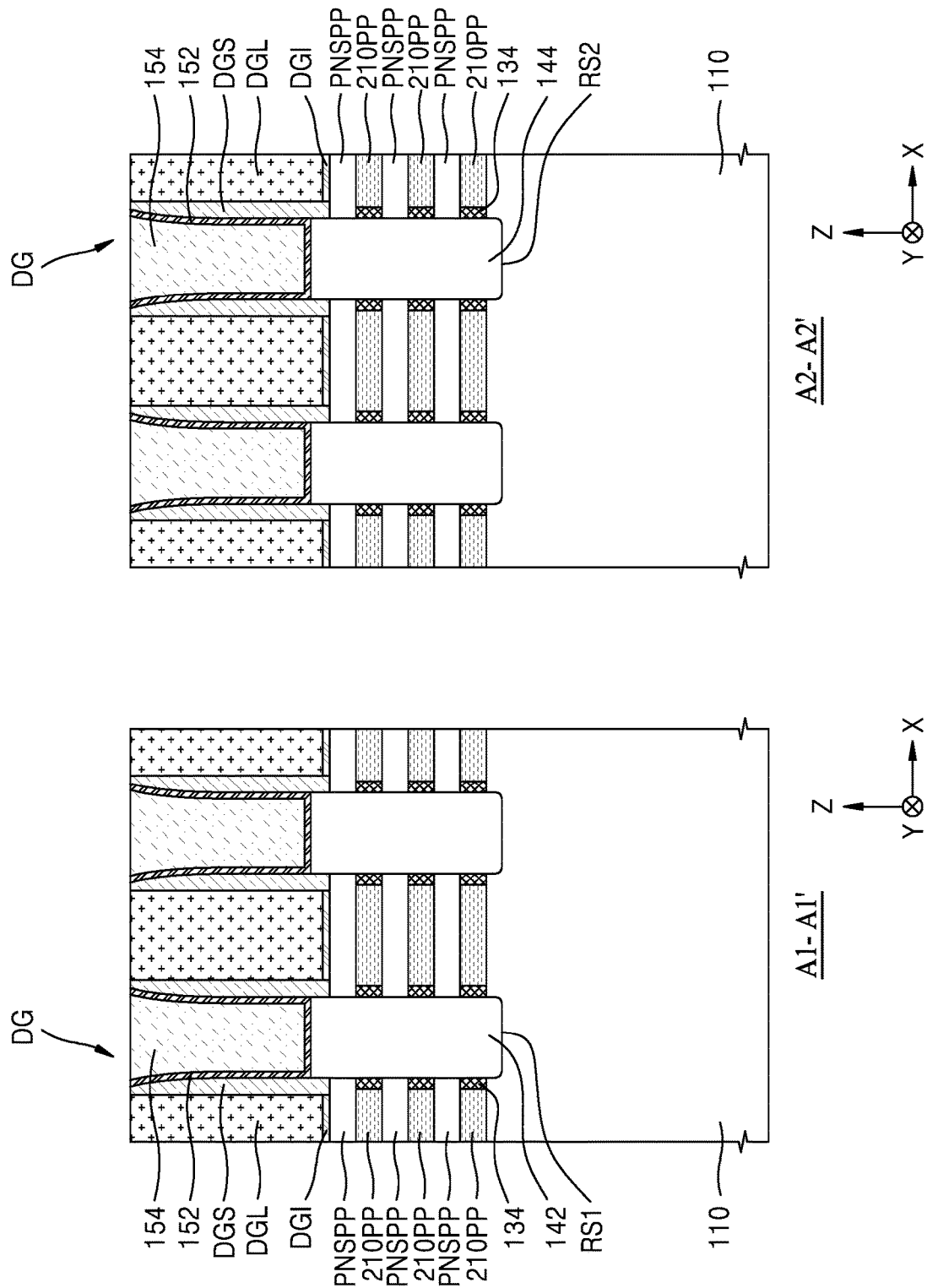

Referring to FIG. 15, a first semiconductor layer 142 and a second semiconductor layer 144 may be formed inside the first recess RS1 and the second recess RS2, respectively. In an example embodiment, the first semiconductor layer 142 and the second semiconductor layer 144 may be formed by epitaxially growing a semiconductor material from surfaces of the substrate 110 and the channel semiconductor pattern PNSPP exposed to the inner wall of the first recess RS1 and the second recess RS2, respectively.

In FIGS. 12 through 15, a method is illustrated in which the first recess RS1 and the second recess RS2 may be simultaneously formed in the first fin-type active area FA1 and the second fin-type active area FA2, respectively, and then the first semiconductor layer 142 and the second semiconductor layer 144 may be simultaneously formed. However, when, for example, the first fin-type active area FA1 is an area for forming an NMOS transistor, and the second fin-type active area FA2 is an area for forming a PMOS transistor, after a protection layer (not shown) is formed on the second fin-type active area FA2, the first recess R1 and the first semiconductor layer 142 may be formed first, and after a protection layer (not shown) is formed on the first fin-type active area FA1, and then the second recess RS2 and the second semiconductor layer 144 may be formed. In this case, a material included in the first semiconductor layer 142 and a material that included in the second semiconductor layer 144 may be different from each other. For example, p-type impurities may be doped in the first semiconductor layer 142 and n-type impurities may be doped in the second semiconductor layer 144.

Thereafter, a gate insulation liner 152 and an inter-gate insulation layer 154 may be formed on the sidewall of the dummy gate structure DG, and on the first semiconductor layer 142 and the second semiconductor layer 144. In an example embodiment, a preliminary gate insulation liner and a preliminary inter-gate insulation layer may be formed in the listed order on the sidewall of the dummy gate structure DG, and on the first semiconductor layer 142 and the second semiconductor layer 144. The preliminary gate insulation liner, and the preliminary inter-gate insulation layer on an upper surface of the gate capping layer DGC may be removed using a planarization process. In an example embodiment, the dummy gate capping layer DGC (refer to FIG. 14) of the dummy gate structure DG may also be removed in the planarization process, and then a top surface of the gate line DGL may be exposed. An upper portion of the dummy gate spacer DGS disposed on sidewalls of the dummy gate capping layer DGC may also be removed in the planarization process.

Figure 16A:
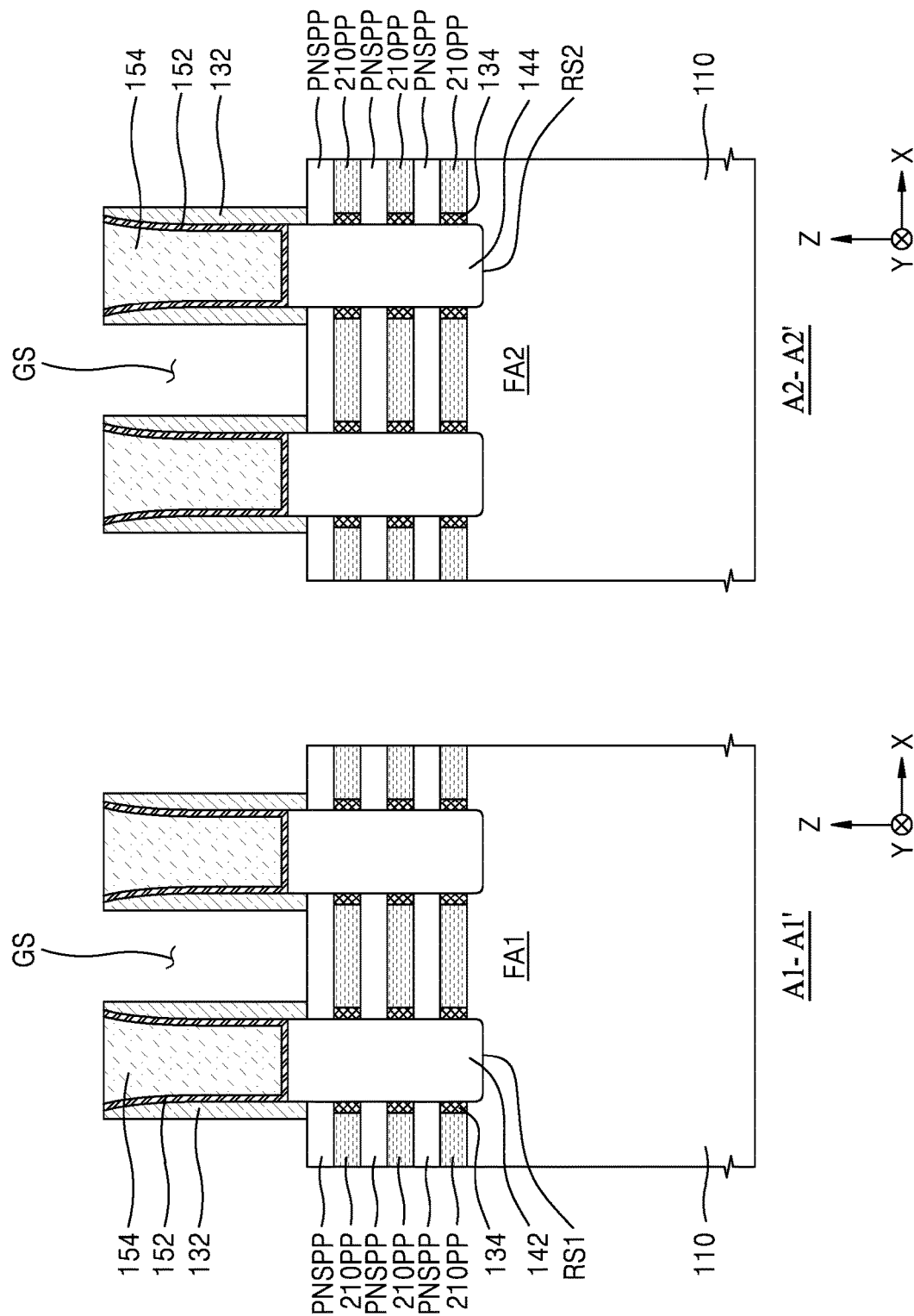

Referring to FIGS. 16A and 16B, the dummy gate line DGL and the dummy gate insulation layer DGI, which are exposed in the planarization process for forming the inter-gate insulation layer 154, may be removed, and then the gate space GS may be formed. The dummy gate spacer DGS exposed by the gate space GS may be referred to as a gate spacer 132.

Figure 17A:
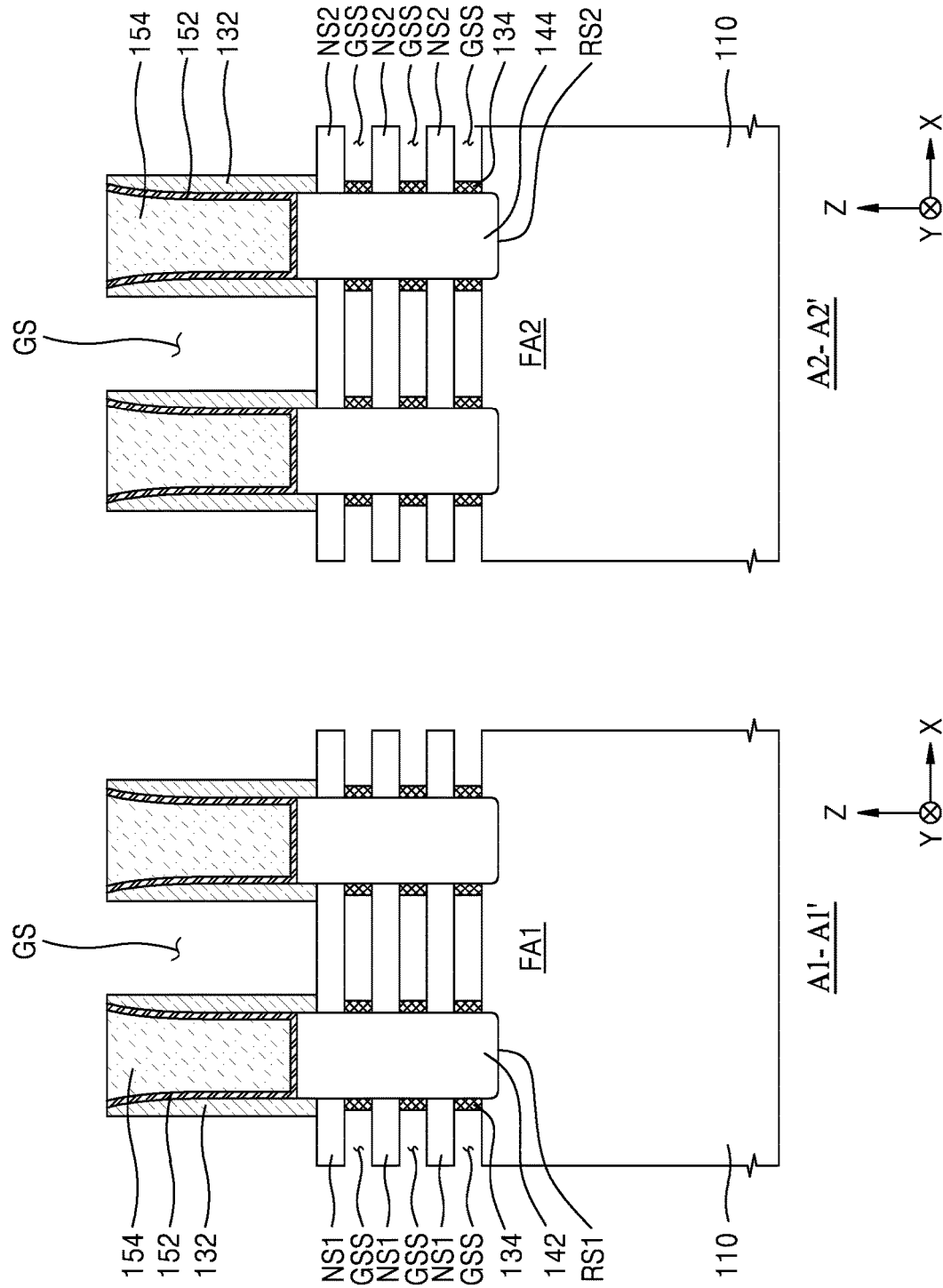
Figure 17B:
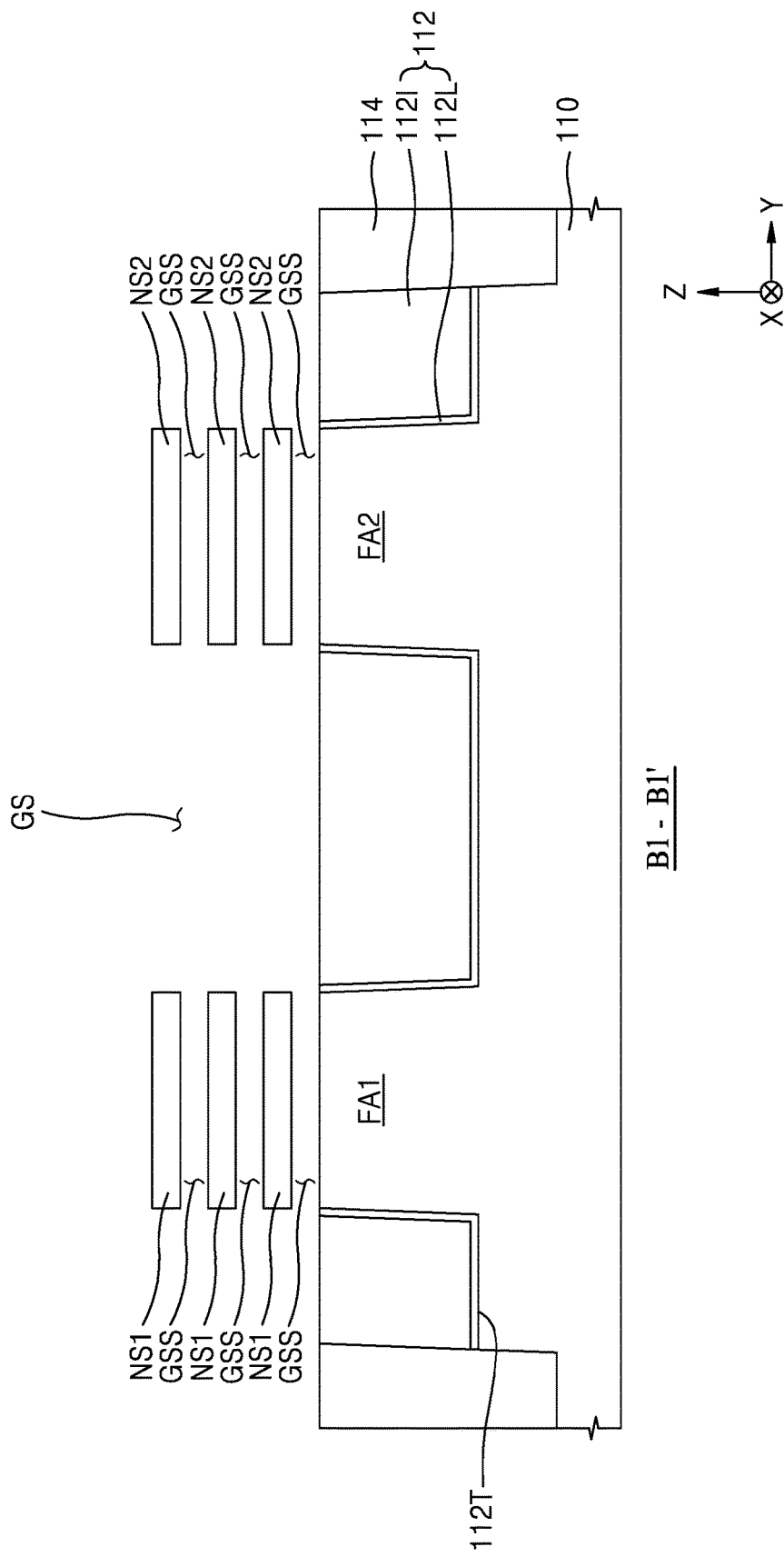

Referring to FIGS. 17A and 17B, by removing the plurality of sacrificial layers 210 remaining on the first and second fin-type active areas FA1 and FA2 exposed through the gate space GS, upper and lower surfaces of the channel semiconductor pattern PNSPP and top surfaces the first and second fin-type active areas FA1 and FA2 may be exposed through the gate space GS. The channel semiconductor pattern PNSPP remaining in the first fin-type active area FA1 may be referred to as the plurality of first semiconductor patterns NS1, the channel semiconductor pattern PNSPP remaining in the second fin-type active area FA2 may be referred to as the plurality of second semiconductor patterns NS2, and a sub-gate space GSS may be formed between two first semiconductor patterns adjacent vertically to each other, between two second semiconductor patterns adjacent vertically to each other, between the top surface of the first fin-type active area FA1 and the lowermost first semiconductor pattern of the plurality of first semiconductor patterns NS1 and/or between the top surface of the second fin-type active area FA2 and the lowermost second semiconductor pattern of the plurality of second semiconductor patterns NS2.

The removal process of the sacrificial pattern 210PP may be a wet etching process using etching selectivity of the sacrificial pattern 210PP with respect to the channel semiconductor pattern PNSPP. During the wet etching process, the sacrificial pattern 210PP may be recessed between two first semiconductor patterns adjacent vertically to each other and/or two second semiconductor patterns adjacent vertically to each other to form an inner spacer 134. In this case, the sacrificial pattern 210PP and the inner spacer 134 may be formed of the same material. The inner spacer 134 that is not be removed in the wet etching process may be exposed on the inner wall of the sub-gate space GSS. In an example embodiment, the sacrificial pattern 210PP of FIGS. 16A and 16B may be partially removed through the gate space GS using the wet etching process to form the sub-gate space GSS, and the reaming portion of the sacrificial pattern 210PP may be referred to as the inner spacer 134. The sub-gate space GSS may be connected to the gate space GS. The sub-gate space GSS may be a region defined by an upper surface of a first semiconductor pattern, a lower surface of another first semiconductor pattern adjacent thereto, and a sidewall of the inner spacer 134. The lowermost gate space may be a region defined by the top surface of the first fin-type active area FA1, a lower surface of the lowermost first semiconductor pattern and a sidewall of the lowermost inner spacer on the first fin-type active area FA1 and/or a region defined by the top surface of the second fin-type active area FA2, a lower surface of the lowermost second semiconductor pattern and a sidewall of the lowermost inner spacer on the second fin-type active area FA2.

Figure 18A:
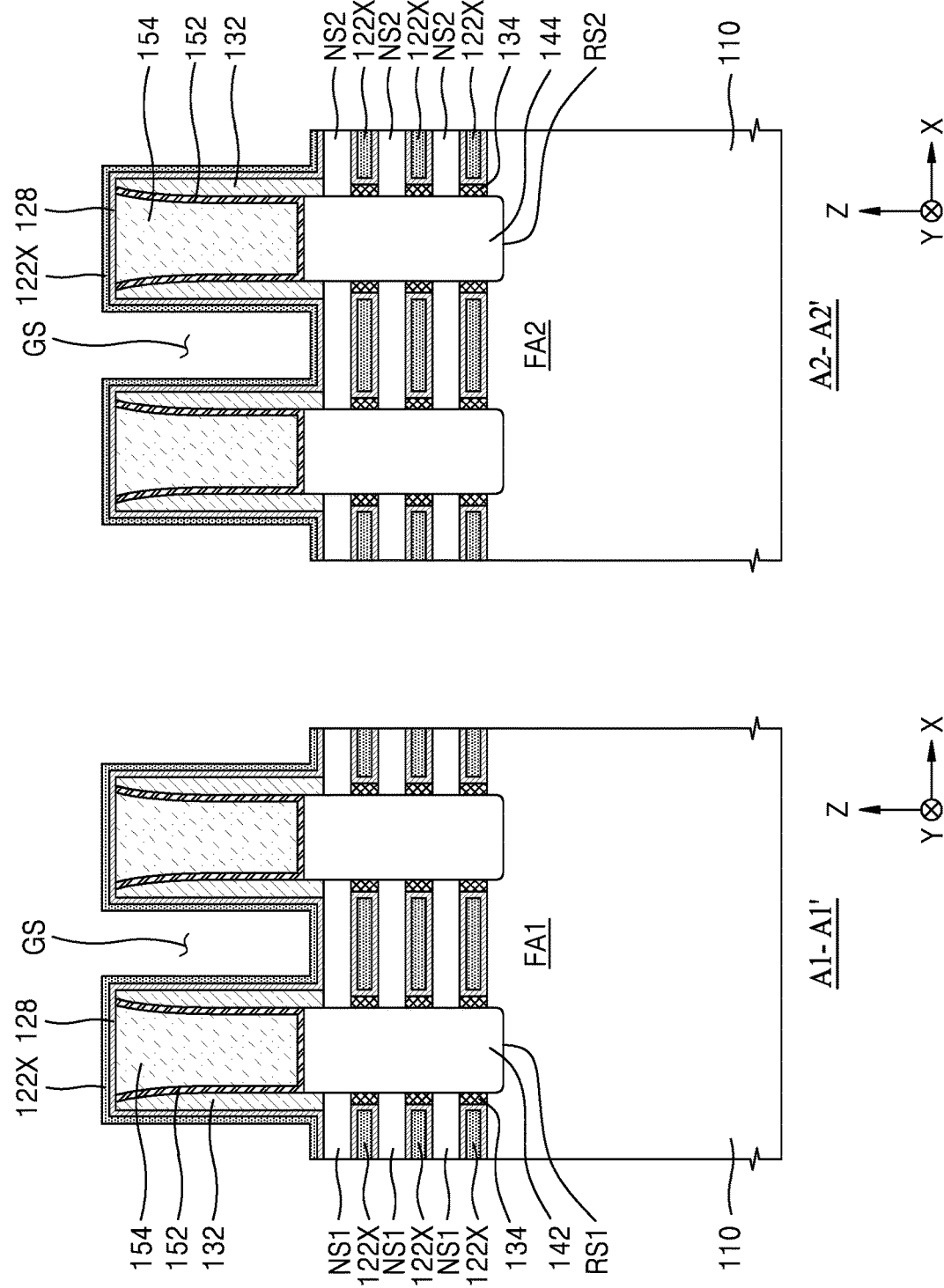
Figure 18B:
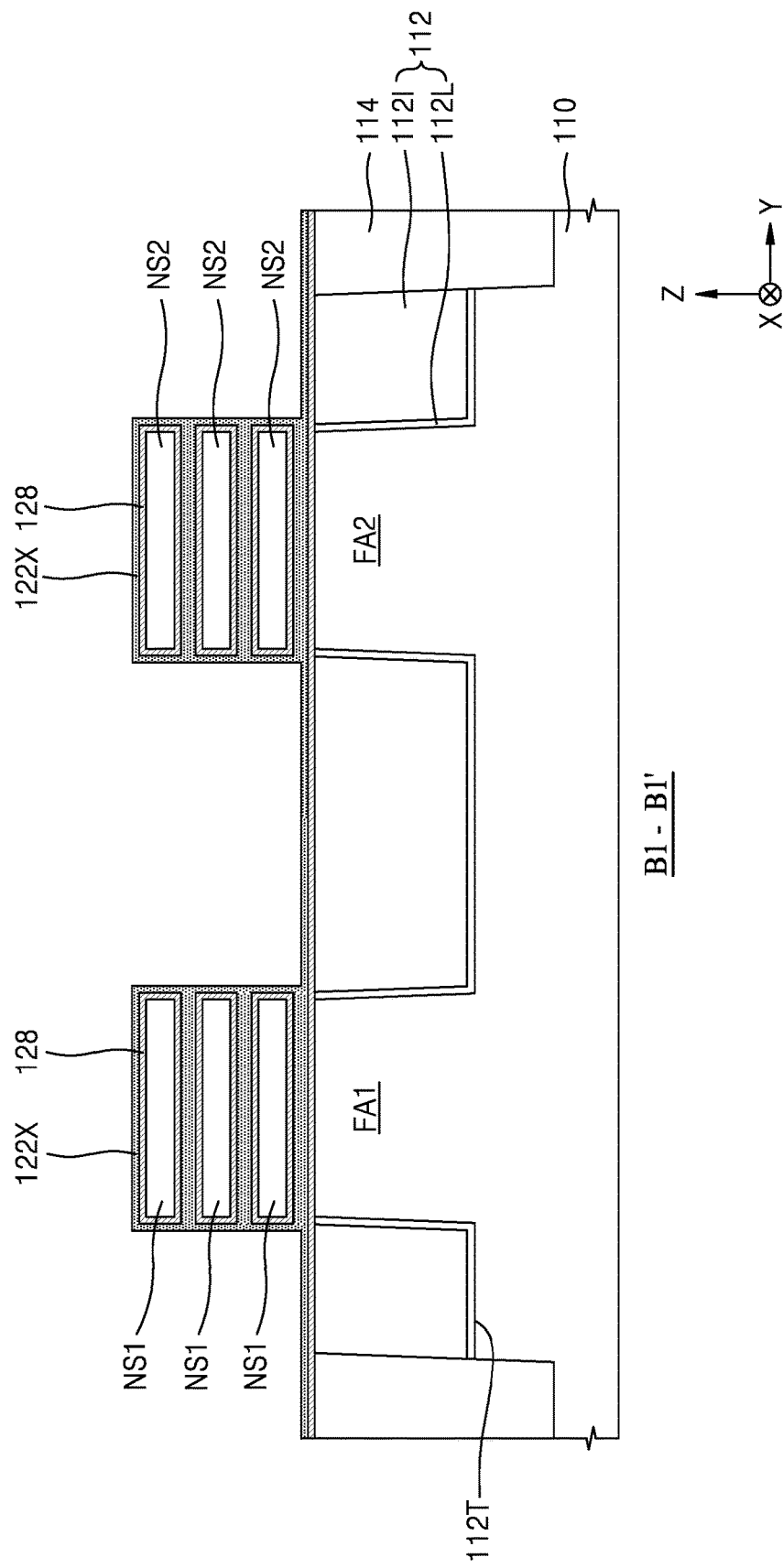

Referring to FIGS. 18A and 18B, a gate insulation layer 128 may be conformally formed on the surfaces exposed to the gate space GS and the sub-gate space GSS. Thereafter, a preliminary work function control layer 122X may be formed conformally on the gate insulation layer 128. The gate insulation layer 128 and the preliminary work function control layer 122X may also be formed on the element isolation layer 112 and the deep trench insulation layer 114.

In example embodiments, the preliminary work function control layer 122X may fill both the sub-gate space GSS disposed between two adjacent first semiconductor patterns of the plurality of first semiconductor patterns NS1 and the sub-gate space GSS disposed between two adjacent second semiconductor patterns of the plurality of second semiconductor patterns NS2. The present invention is not limited thereto. In an example embodiment, the preliminary work function control layer 122X may be formed with a thickness in a manner that the preliminary work function control layer 122X does not fill a portion of the inside of the sub-gate space GSS between two adjacent first semiconductor patterns of the plurality of first semiconductor patterns NS1, and a portion of the inside of the sub-gate space GSS between two adjacent second semiconductor patterns of the plurality of second semiconductor patterns NS2. In an example embodiment, the preliminary work function control layer 122X may be formed so that the sub-gate space GSS is completely filled, the sub-gate space GSS is partially filled or the sub-gate space GSS is not filled, depending on the thickness of the preliminary work function control layer 122X.

The preliminary work function control layer 122X may include Al, Cu, Ti, Ta, W, Mo, TaN, NiSi, CoSi, TiN, WN, TiAl, TiAlC, TiAlN, TaCN, TaC, TaSiN, or a combination thereof. In some examples, the preliminary work function control layer 122X may be formed as a single layer formed of TiN. In another example, the preliminary work function control layer 122X may be formed in a bi-layer structure that includes a lower layer formed of TaN and an upper layer formed of TiN.

Figure 19B:
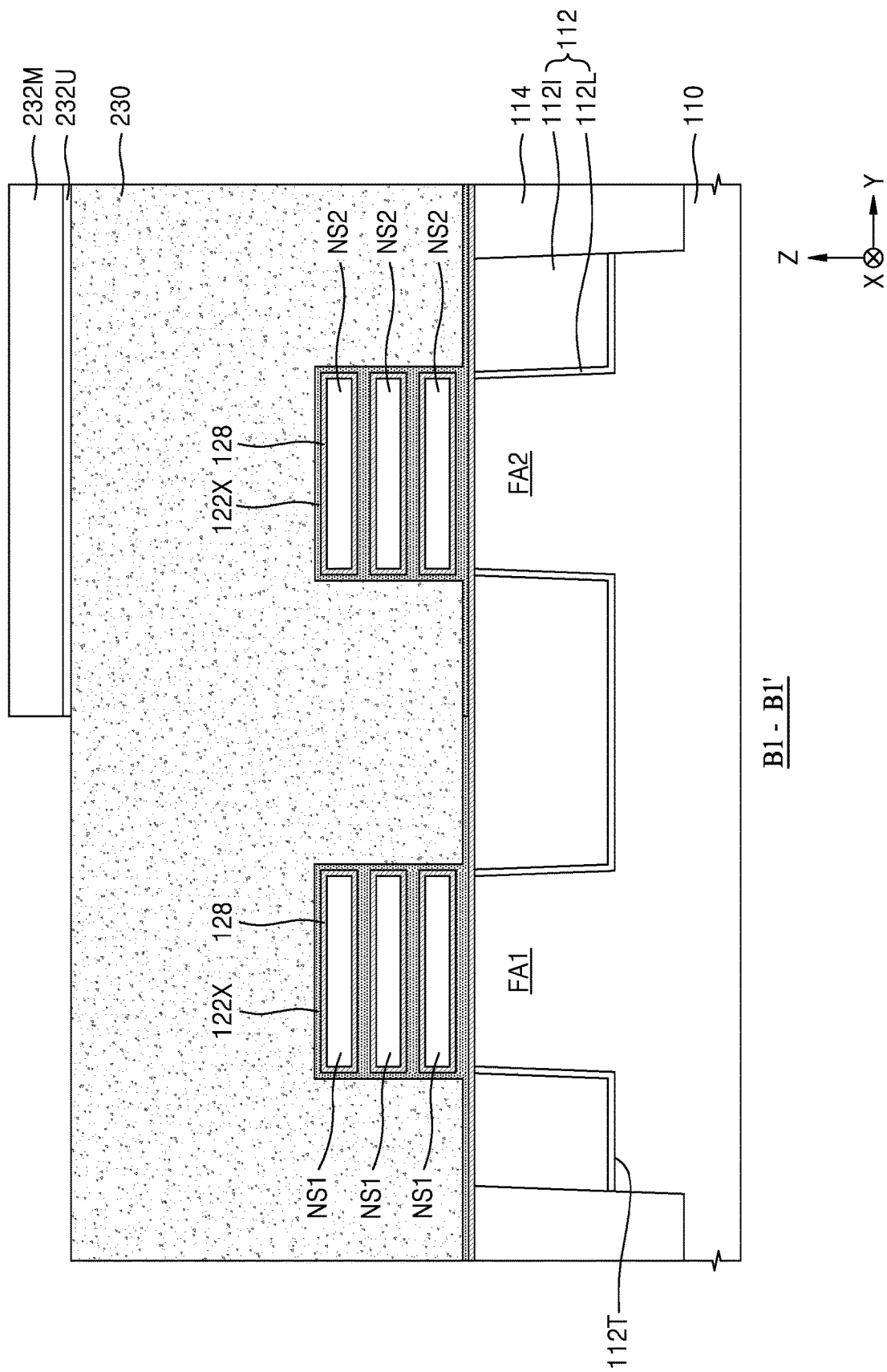

Referring to FIGS. 19A and 19B, a mask material layer 230 filling the gate space GS may be formed on the preliminary work function control layer 122X. Thereafter, a lower layer 232U and a hardmask pattern 232M may be formed on the mask material layer 230 overlapping the second fin-type active area FA2.

In example embodiments, the mask material layer 230 may include a carbon-based insulation material. For example, the mask material layer 230 may include a material having a relatively high carbon content ratio. For example, the mask material layer 230 may include a material such as SiC:H, SiCN, SiCN:H, silicon oxycarbide (SiOCN), spin on hardmask (SOH), Si based anti-reflective coating (ARC), spin on glass (SOG), advanced planarization layer (APL), and organic dielectric layer (ODL), but the material is not limited thereto.

Figure 20A:
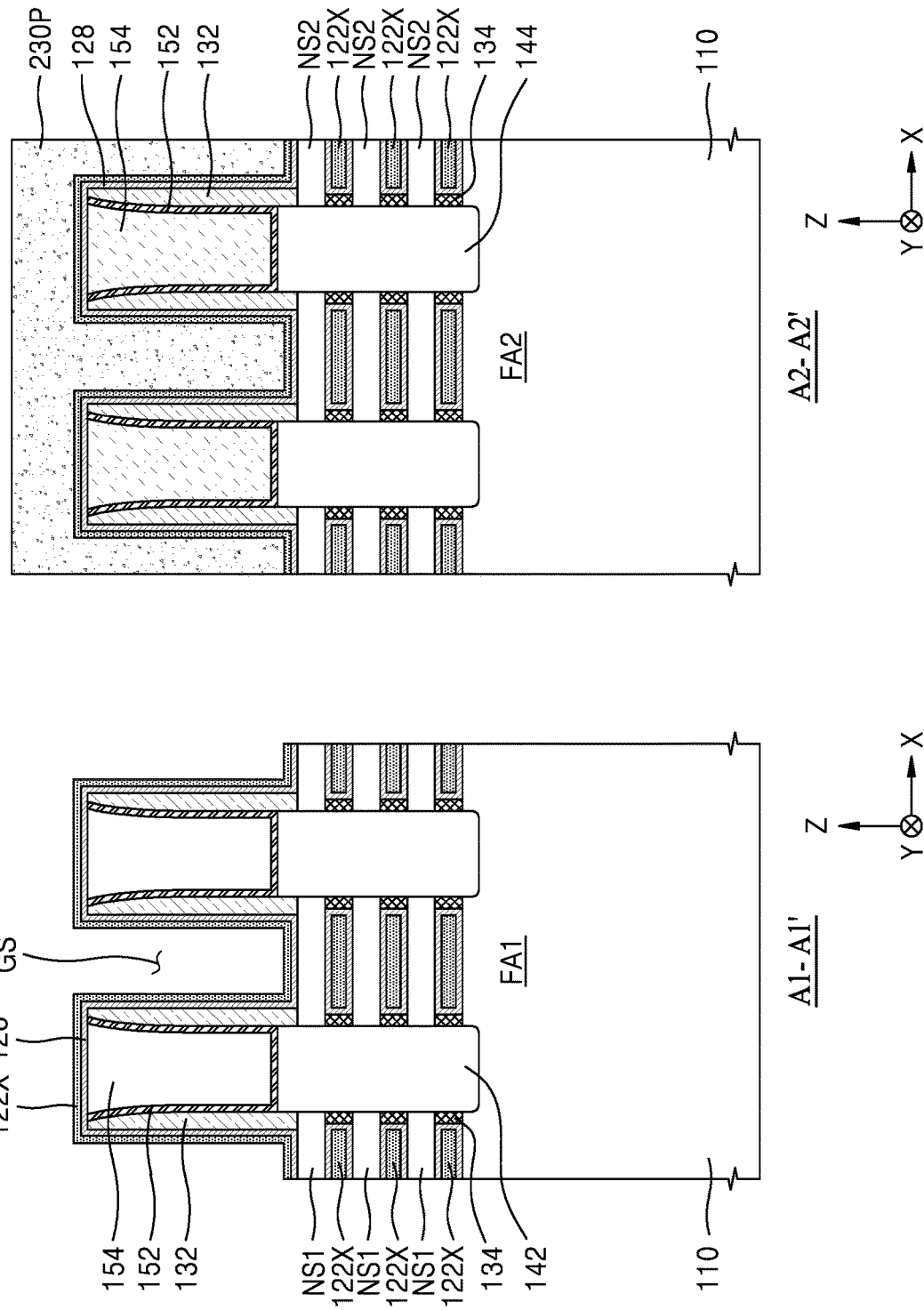

Referring to FIGS. 20A and 20B, by etching the mask material layer 230 by using the lower layer 232U and the hardmask pattern 232M as etching masks, a first mask pattern 230P covering a structure on the top portion of the second fin-type active area FA2 may be formed. Accordingly, the gate space GS may be formed again, and a portion of the preliminary work function control layer 122X surrounding each of the plurality of first semiconductor patterns NS1 on the first fin-type active area FA1 may be exposed by the gate space GS.

Figure 21A:
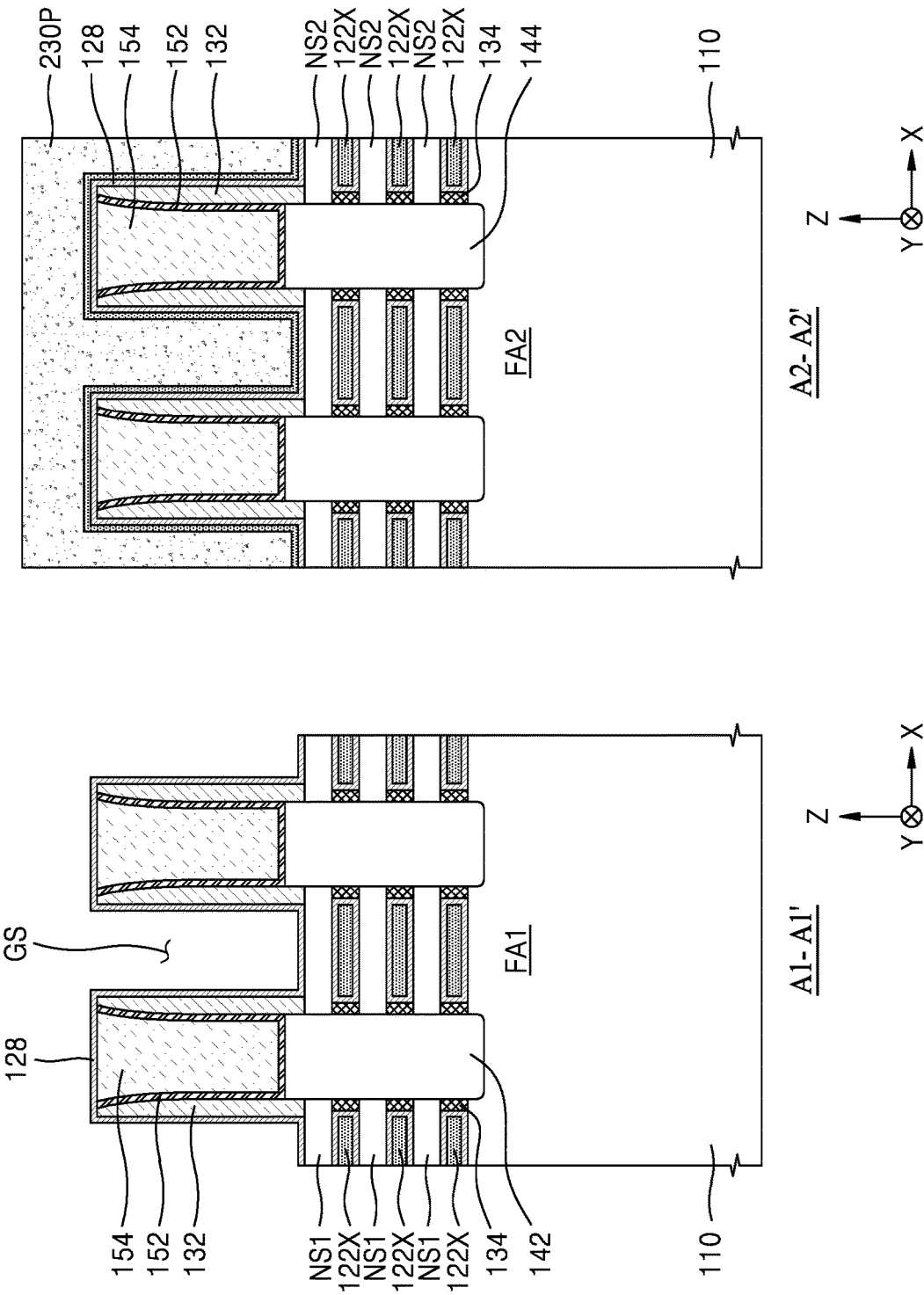
Figure 21B:
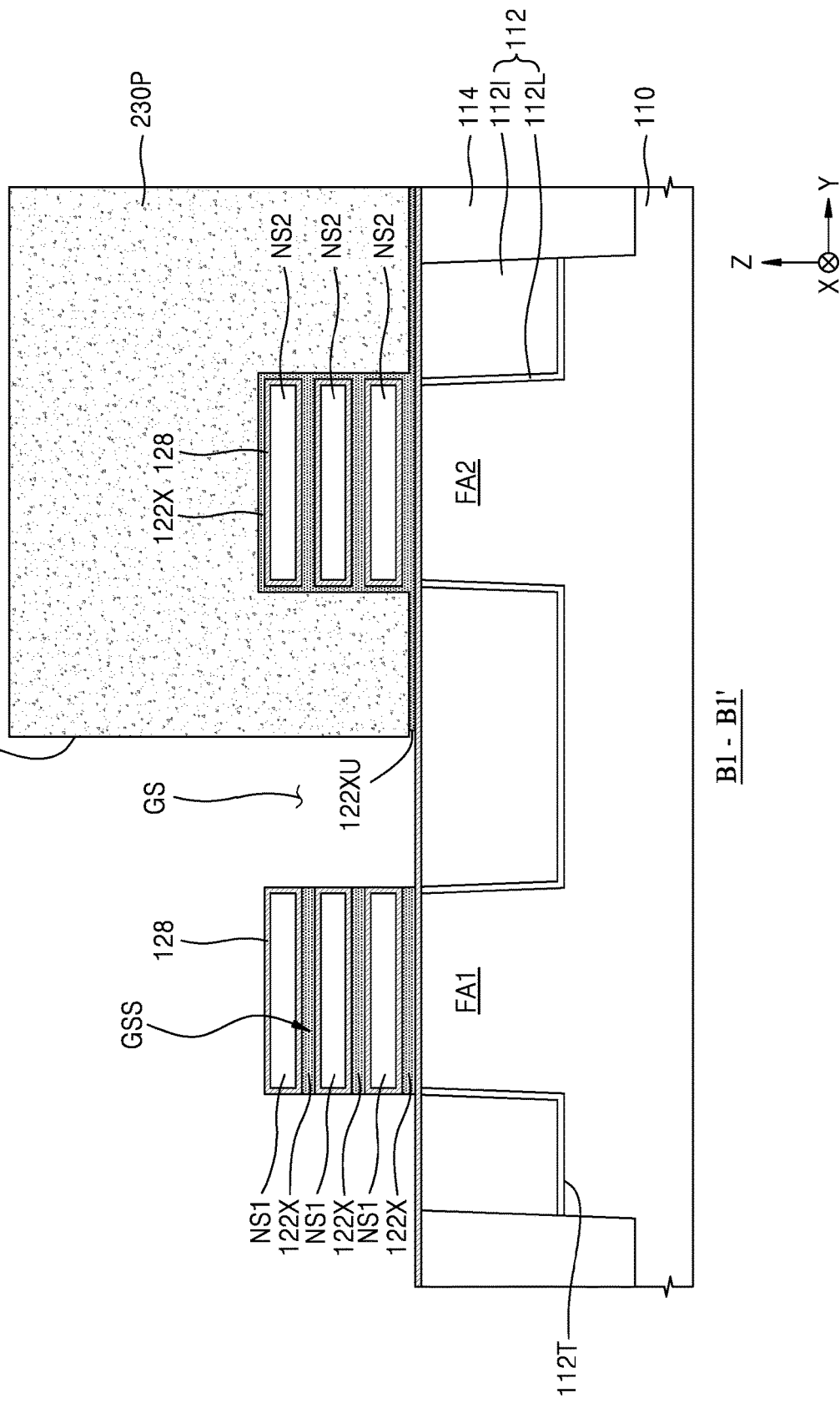

Referring to FIGS. 21A and 21B, a portion of the preliminary work function control layer 122X disposed on the first fin-type active area FA1, a portion of the preliminary work function control layer 122X disposed on the element isolation layer 112, and a portion of the preliminary work function control layer 122X disposed on the deep trench insulation layer 114 may be removed by using the first mask pattern 230P as an etching mask.

In example embodiments, the removal process of the preliminary work function control layer 122X by using the first mask pattern 230P may be a wet etching process. The wet etching process may be performed during a time period (or, a first etching period) in which the preliminary work function control layer 122X on the sidewall of the gate space GS is removed so that the gate space GS is formed again. As illustrated in FIG. 21B, a portion of the preliminary work function control layer 122X on the top surface of the uppermost first semiconductor pattern, a portion of the preliminary work function control layer 122X on the sidewall of each of the plurality of first semiconductor patterns NS1, the element isolation layer 112, and a portion of the preliminary work function control layer 122X on the deep trench insulation layer 114 may be removed, and the gate insulation layer 128 may be exposed to the inner wall of the gate space GS. On the other hand, in the wet etching process using the first mask pattern 230P as an etching mask, a portion of the preliminary work function control layer 122X between two first semiconductor patterns adjacent vertically to each other may remain without being etched. Accordingly, after performing the wet etching process using the first mask pattern 230P, the preliminary work function control layer 122X may remain as filling in the sub-gate space GSS.

As illustrated in FIG. 21B, in the wet etching process using the first mask pattern 230P as an etching mask, a portion of the preliminary work function control layer 122X between a side wall 230PS of the first mask pattern 230P and the gate insulation layer 128 may be also removed, and an undercut region 122XU defined by the preliminary work function control layer 122X may be formed under the side wall of the first mask pattern 230P.

Figure 22A:
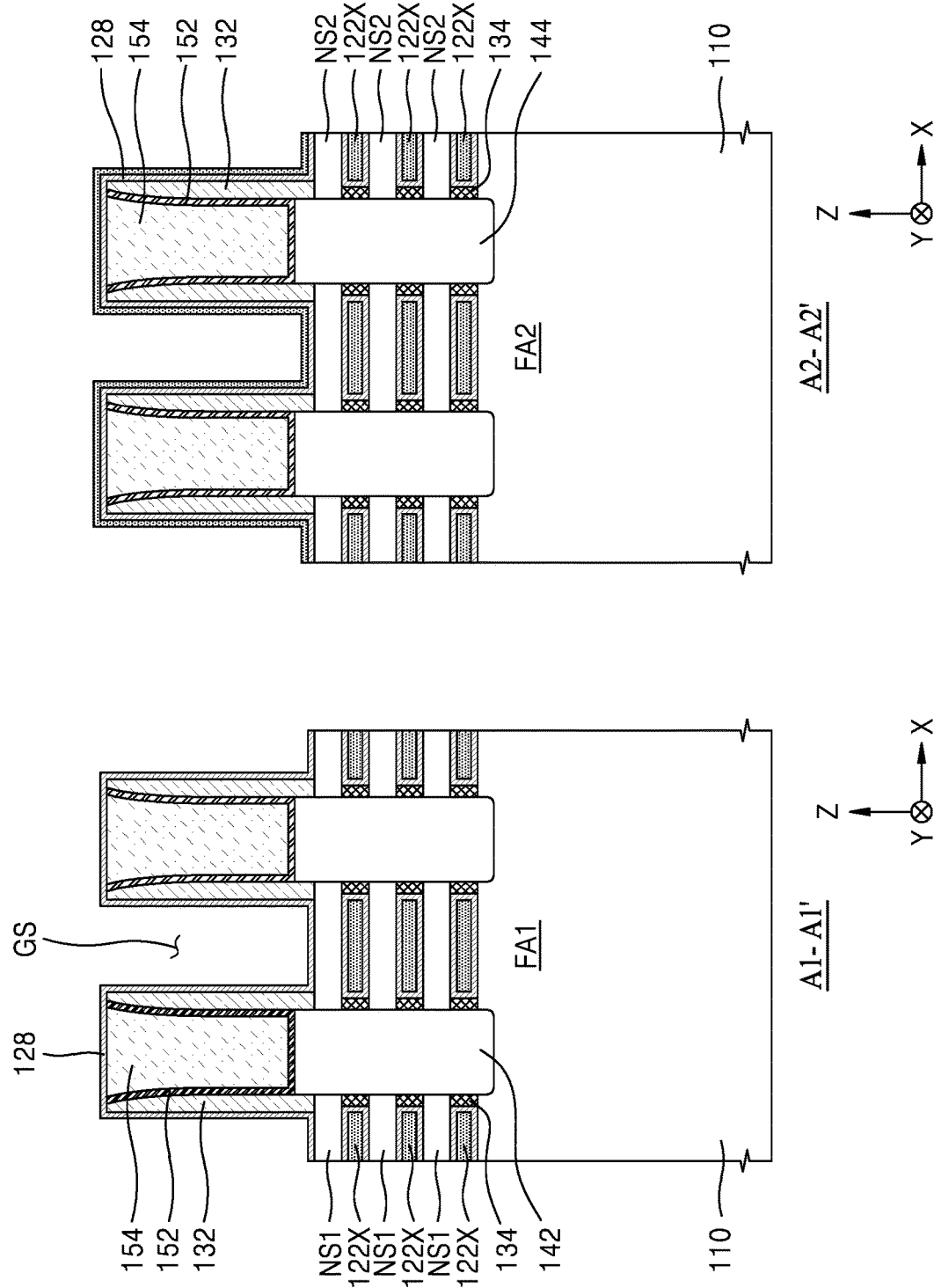
Figure 22B:
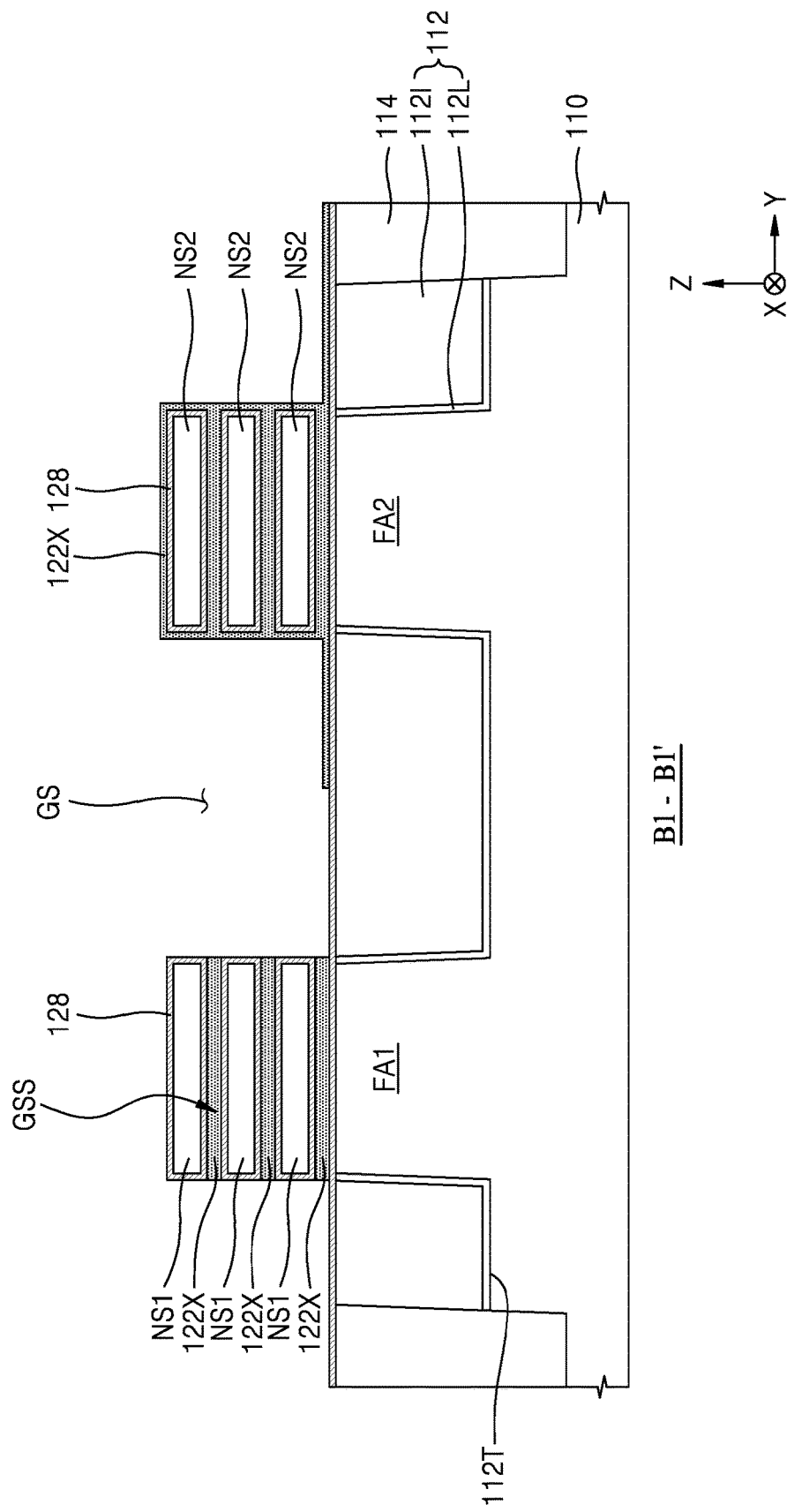

Referring to FIGS. 22A and 22B, the first mask pattern 230P (refer to FIG. 21B) may be removed.

Figure 23A:
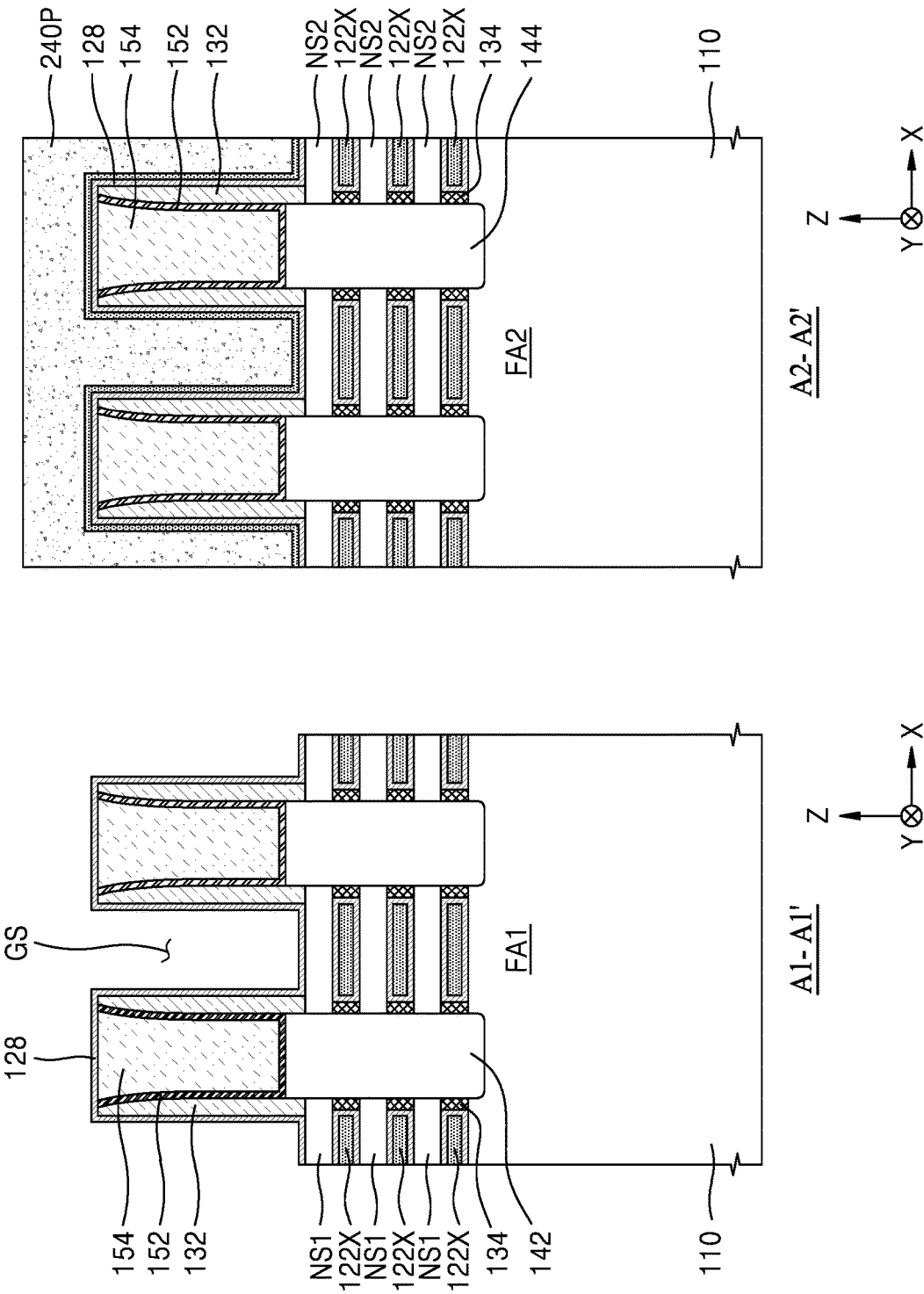

Referring to FIGS. 23A and 23B, a mask material layer (not shown) filling the gate space GS may be formed on the preliminary work function control layer 122X and the gate insulation layer 128, and the second mask pattern 240P covering the structure above the second fin-type active area FA2 may be formed by patterning the mask material layer (not shown). The second mask pattern 240P may be formed by using the same material and manufacturing method as the first mask pattern 230P.

In this case, the second mask pattern 240P may be arranged to completely cover an end portion of the preliminary work function control layer 122X extending from the preliminary work function control layer 122X formed in the second fin-type active area FA2. For example, the sidewall 240PS of the second mask pattern 240P may be apart from the end portion of the preliminary work function control layer 122X by a distance corresponding to the third distance S22, and accordingly, the preliminary work function control layer 122X may not be exposed in the gate space GS.

Figure 24A:
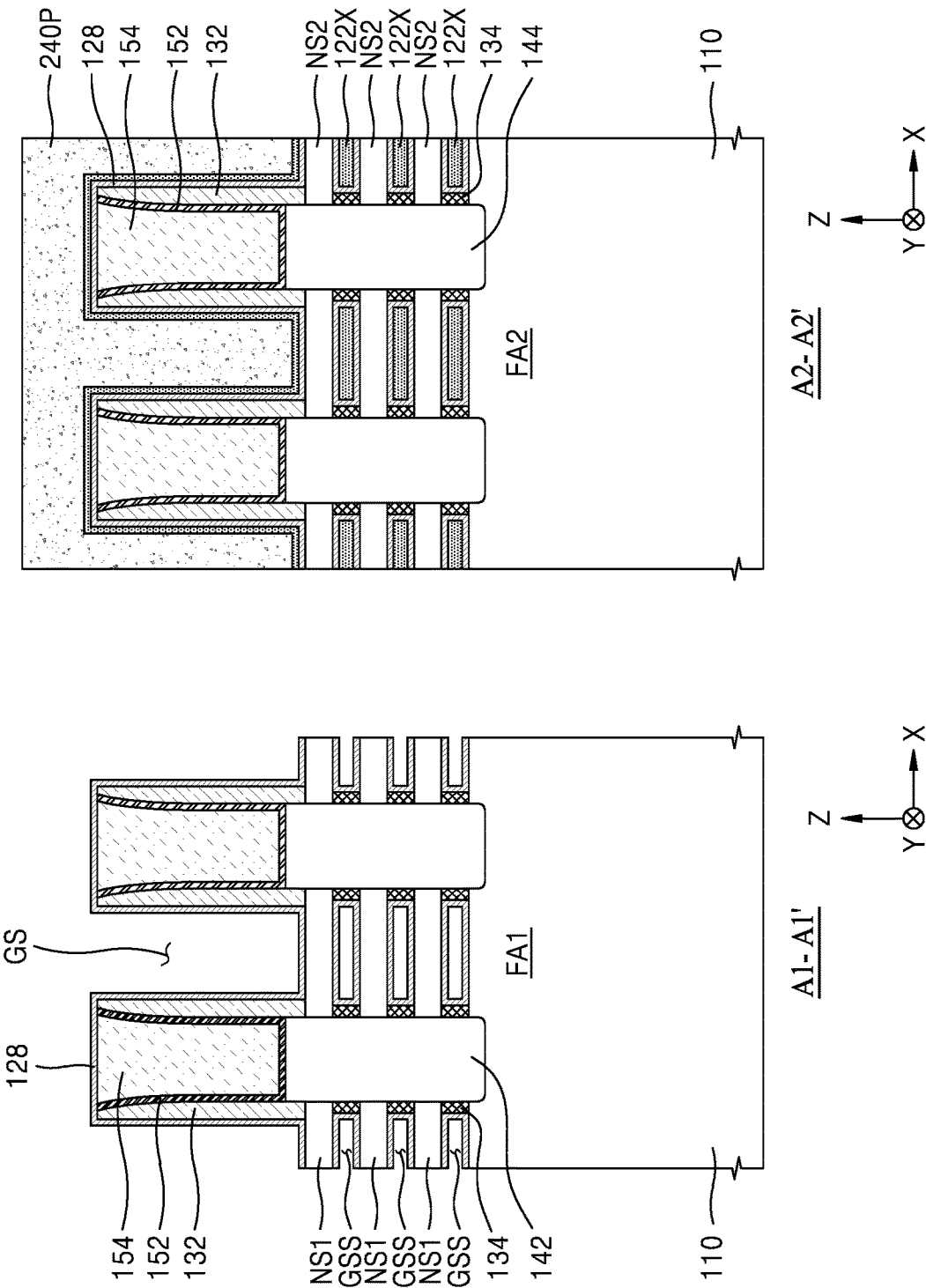
Figure 24B:
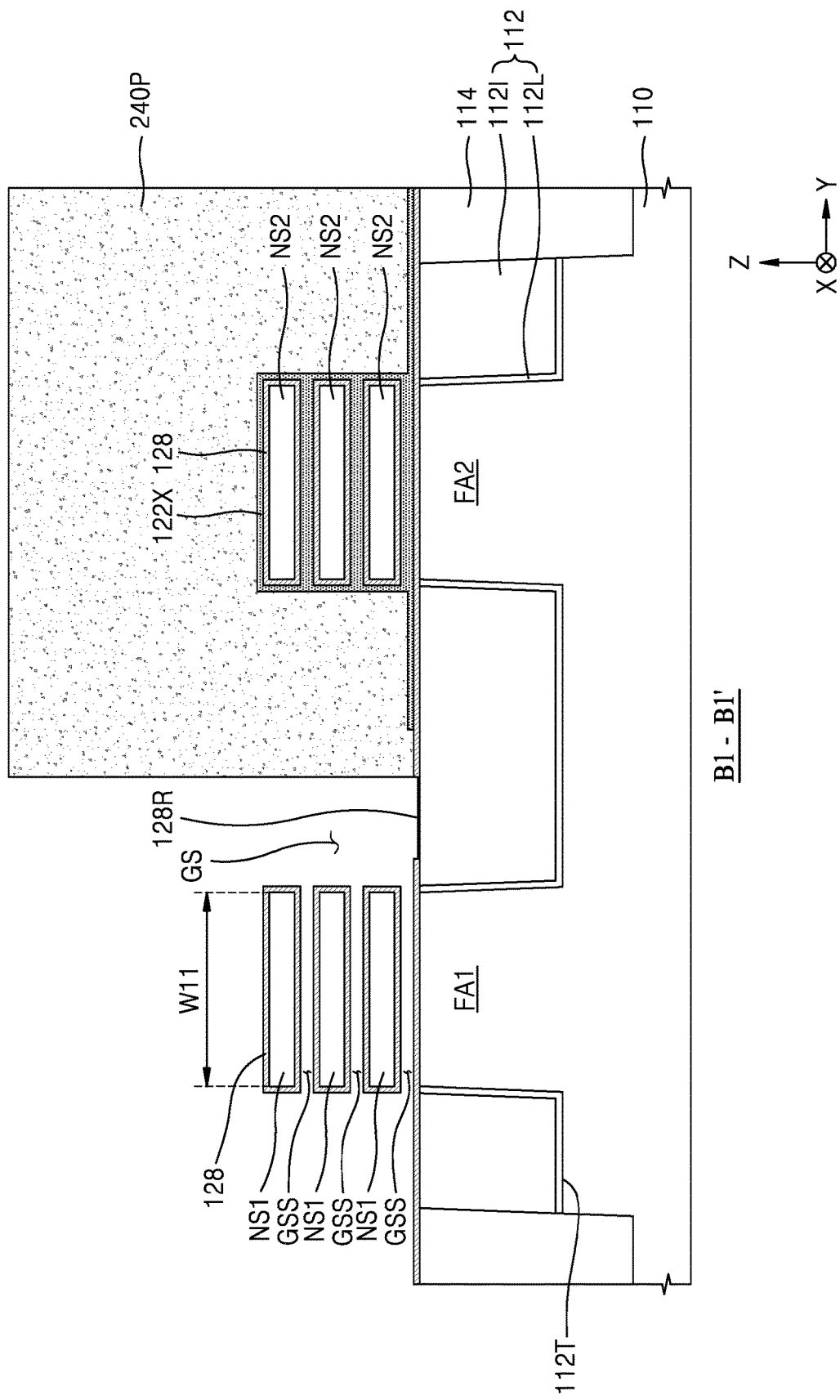

Referring to FIGS. 24A and 24B, portions of the preliminary work function control layers 122X between two first semiconductor patterns adjacent vertically to each other may be removed by using the second mask pattern 240P as an etching mask.

The removing process of the preliminary work function control layer 122X by using the second mask pattern 240P may be a wet etching process. The wet etching process may be performed for a relatively long time until the portion of the preliminary work function control layer 122X inside the sub-gate space GSS is completely removed. For example, in the wet etching process, an etchant or etching gas may penetrate into the inside of the sub-gate space GSS in a second direction (Y direction) to remove the preliminary work function control layer 122X, and then, each of the plurality of first semiconductor patterns NS1 may have the relatively large first width W11 in the second direction (Y direction). Accordingly, the wet etching process may be performed during a second etching period longer than the first etching period, and the second etching period may be relatively long enough, for example, to remove about 50% of the first width W11.

In the wet etching process using the second mask pattern 240P, since the end portion of the preliminary work function control layer 122X extending from the preliminary work function control layer 122X formed on the second fin-type active area FA2 is completely covered by the second mask pattern 240P, the portion of the preliminary work function control layer 122X on the second fin-type active area FA2 may not be exposed.

After all portions of the preliminary work function control layers 122X between two first semiconductor patterns adjacent vertically to each other are removed, the second mask pattern 240P may be removed.

In the wet etching process using the second mask pattern 240P and/or in the process of removing the second mask pattern 240P, a portion of the gate insulation layer 128 which is on the element isolation layer 112 and exposed to the etching atmosphere may be removed together with the second mask pattern 240P so that a recess region 128R may be formed in the gate insulating layer 128. Although the recess region 128R is illustrated as being formed to have a relatively flat bottom level under the sidewalls of the second mask pattern 240P, a shape of the recess region 128R may be different from the shape thereof illustrated in FIG. 24B according to wet etch process conditions and second mask pattern 240P removal process conditions, etc.

Figure 25A:
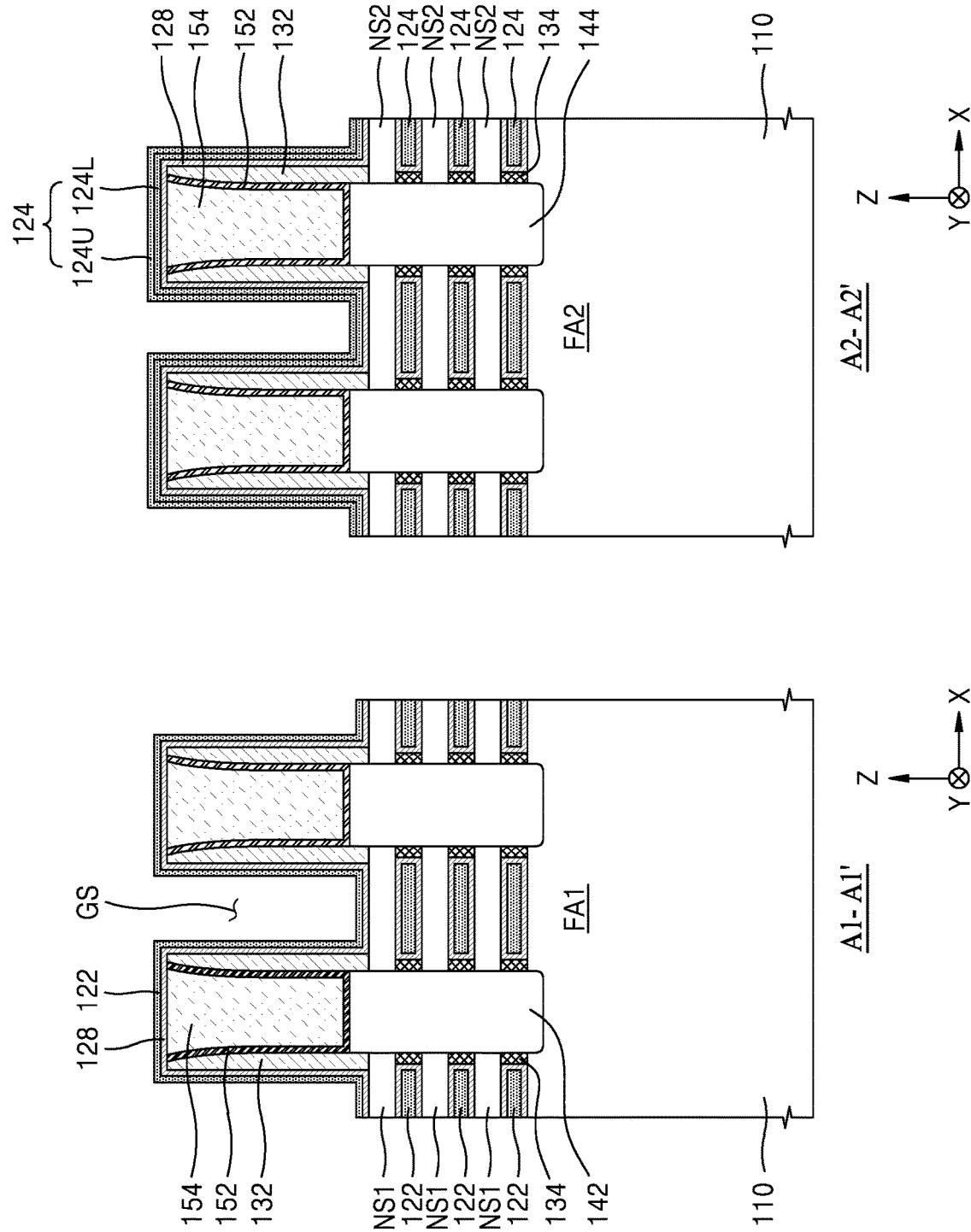

Referring to FIGS. 25A and 25B, a first work function control layer 122 may be formed on the gate insulation layer 128 on the first fin-type active area FA1, and an upper second work function control layer 124U may be formed on the preliminary work function control layer 122X on the second fin-type active area FA2. The portion of the preliminary work function control layer 122X on the second fin-type active area FA2 may be referred to as a lower second work function control layer 124L. The first work function control layer 122 may include a step portion 122P that is formed to be in contact with the recess region 128R of the gate insulation layer 128.

Referring again to FIGS. 2A and 2B, the buried conductive layer 126 filling the gate space GS may be formed on the first and second work function control layers 122 and 124, and the gate structure 120 may be formed by planarizing the top portion of the buried conductive layer 126 until the top surface of the inter-gate insulation layer 154 is exposed.

Thereafter, the first top insulation layer 162 may be formed, the contact hole 166H penetrating through the first top insulation layer 162 may be formed, and then the contact plug 166 may be formed by filling the contact hole 166H with a conductive material. Thereafter, the second top insulation layer 164 may be formed, and by performing a forming process of the via holes (172H and 174H) and a filling process of the conductive layer, the first wiring layer 172 and the second wiring layer 174 may be further formed.

According to the above-described method of manufacturing the integrated circuit device 100, only the portions of the preliminary work function control layers 122X on the top surface and on the side wall of each of the plurality of first semiconductor patterns NS1 are first removed by using the first mask pattern 230P as an etching mask, and then, the portion of the preliminary work function control layer 122X filling the space between two first semiconductor patterns adjacent vertically to each other (that is, the portion of the preliminary work function control layer 122X in the sub-gate space GSS) may be removed by using the second mask pattern 240P as an etching mask. Since the second mask pattern 240P completely covers the portion of the preliminary work function control layer 122X in the second transistor forming region, unwanted etching of the preliminary work function control layer 122X in the second transistor forming region may be prevented, while it is possible to completely remove the portion of the preliminary work function control layer 122X in the sub-gate space GSS in the first transistor forming region. Therefore, a precise control of the threshold voltage of the integrated circuit device 100 may be possible.

While the inventive concept has been particularly shown and described with reference to embodiments thereof, it will be understood that various changes in form and details may be made therein without departing from the spirit and scope of the following claims.

What is claimed is:

1. An integrated circuit device comprising:
a first fin-type active area protruding from a surface of a substrate and extending in a first direction;
a second fin-type active area protruding from the surface of the substrate, the second fin-type active area being spaced apart from the first fin-type active area in a second direction perpendicular to the first direction;
an element isolation layer between the first fin-type active area and the second fin-type active area on the substrate;
a plurality of first semiconductor patterns on a top surface of the first fin-type active area, each of the plurality of first semiconductor patterns having a channel area;
a plurality of second semiconductor patterns on a top surface of the second fin-type active area, each of the plurality of second semiconductor patterns having a channel area;
a first gate structure extending on the first fin-type active area in the second direction, the first gate structure including a first work function control layer surrounding each of the plurality of first semiconductor patterns and including a step portion on the element isolation layer;
a second gate structure extending on the second fin-type active area in the second direction, the second gate structure including a second work function control layer surrounding each of the plurality of second semiconductor patterns; and
a gate insulation layer disposed on the first fin-type active area, the second fin-type active area, and the element isolation layer,
wherein the gate insulation layer includes a recess region on the element isolation layer, and
wherein the recess region of the gate insulation layer is in contact with the step portion of the first work function control layer.

2. The integrated circuit device of claim 1, wherein
the first work function control layer has a first thickness in a third direction perpendicular to the surface of the substrate,
the second work function control layer has a second thickness that is greater than the first thickness in the third direction, and
the step portion is disposed on the element isolation layer at a first distance in the second direction from an end portion of the second work function control layer.

3. The integrated circuit device of claim 1, further comprising:
a conductive layer disposed on the substrate and extending in the second direction,
wherein the first gate structure further includes:
a first portion of the conductive layer on the first work function control layer; and
a first portion of the gate insulation layer between the first fin-type active area and the first work function control layer, and between the first work function control layer and each of the plurality of first semiconductor patterns,
wherein the second gate structure further includes:
a second portion of the conductive layer on the second work function control layer; and
a second portion of the gate insulation layer, the second portion of the gate insulation layer being disposed between the second fin-type active area and the second work function control layer, and between the second work function control layer and each of the plurality of second semiconductor patterns.

4. The integrated circuit device of claim 3, wherein
the gate insulation layer is between a top surface of the element isolation layer and the step portion of the first work function control layer to separate the element isolation layer from the first work function control layer.

5. The integrated circuit device of claim 3, wherein
the gate insulation layer has a laminated structure in which an interface layer and a high-k dielectric layer are sequentially arranged on the element isolation layer, and
the step portion of the first work function control layer passes through the high-k dielectric layer to be in contact with the interface layer.

6. The integrated circuit device of claim 1,
wherein the gate insulation layer has a laminated structure in which an interface layer and a high-k dielectric layer are sequentially arranged on the element isolation layer, and
wherein the recess region is formed in a portion of the high-k dielectric layer, and the recess region of the high-k dielectric layer is interposed between the step portion of the first work function control layer and the interface layer.

7. The integrated circuit device of claim 1, wherein
a bottom surface of the step portion of the first work function control layer is positioned lower than a bottom surface of a portion of the second work function control layer disposed on the element isolation layer.

8. The integrated circuit device of claim 1, wherein
each of the plurality of first semiconductor patterns has a first width in the second direction,
the plurality of first semiconductor patterns and the plurality of second semiconductor patterns are spaced apart from each other by a first distance in the second direction,
the plurality of first semiconductor patterns and the step portion of the first work function control layer are spaced apart from each other by a second distance in the second direction, and
the second distance is less than the first distance.

9. The integrated circuit device of claim 8, wherein
the first distance is in a range of about 50% to about 200% of the first width.

10. The integrated circuit device of claim 1, wherein
the first work function control layer and the second work function control layer are formed of the same material including TiN, and
a thickness of the second work function control layer is greater than that of the first work function control layer.

11. The integrated circuit device of claim 1, wherein
the first work function control layer has a multi-layer structure of a lower first work function control layer including TaN and an upper first work function control layer including TiN, and
the second work function control layer has a triple-layer structure of a lower second work function control layer including TaN, an intermediate second work function control layer including TiN, and an upper second work function control layer including TiN.

12. The integrated circuit device of claim 11, wherein
a thickness of the upper second work function control layer is identical with that of the upper first work function control layer, and
a thickness of the lower second work function control layer is identical with that of the lower first work function control layer.

13. An integrated circuit device comprising:
a first fin-type active area protruding from a surface of a substrate and extending in a first direction;
a second fin-type active area protruding from the surface of the substrate, the second fin-type active area being spaced apart from the first fin-type active area in a second direction perpendicular to the first direction;
an element isolation layer between the first fin-type active area and the second fin-type active area on the substrate;
a plurality of first semiconductor patterns being spaced apart from a top surface of the first fin-type active area, each of the plurality of first semiconductor patterns having a channel area;
a plurality of second semiconductor patterns being spaced apart from a top surface of the second fin-type active area, each of the plurality of second semiconductor patterns having a channel area;
a first work function control layer including a first portion surrounding each first semiconductor pattern of the plurality of first semiconductor patterns, a second portion on the element isolation layer, and a connecting portion connecting the first portion and the second portion to each other, the second portion of the first work function control layer including a step portion on the element isolation layer and having a first thickness;
a second work function control layer including a third portion surrounding each second semiconductor pattern of the plurality of second semiconductor patterns and a fourth portion extending from the third portion onto the element isolation layer, the fourth portion of the second work function control layer having a second thickness that is greater than the first thickness; and
a gate insulation layer between the first fin-type active area and the first work function control layer, between the first work function control layer and each of the plurality of first semiconductor patterns and, between the second fin-type active area and the second work function control layer, and between the second work function control layer and each of the plurality of second semiconductor patterns,
wherein the gate insulation layer includes a recess region at a portion where the gate insulation layer is in contact with the step portion.

14. The integrated circuit device of claim 13, wherein,
the step portion is positioned at a predetermined distance from an end portion of the fourth portion of the second work function control layer.

15. The integrated circuit device of claim 13,
wherein the second work function control layer has a double-layer structure comprising a lower first work function control layer and an upper first work function control layer which are arranged sequentially on the second fin-type active area and each of the plurality of second semiconductor patterns,
wherein the upper first work function control layer is connected to the first work function control layer, and
wherein a location where the upper first work function control layer and the first work function control layer are connected to each other is on a portion of the element isolation layer between the recess region of the element isolation layer and the second fin-type active area.

16. An integrated circuit device comprising:
a buried insulation layer on a substrate;
a first active area, a second active area and an element isolation layer on the buried insulation layer, wherein the first active area and the second active area are arranged spaced apart from each other by the element isolation layer;
a plurality of first semiconductor patterns on the first active area, the plurality of first semiconductor patterns being spaced apart from a top surface of the first active area and each of the plurality of first semiconductor patterns having a channel area;
a plurality of second semiconductor patterns on the second active area, the plurality of second semiconductor patterns being apart from a top surface of the second active area and each of the plurality of second semiconductor patterns having a channel area;
a first work function control layer including a first portion surrounding each of the plurality of first semiconductor patterns and a second portion extending from the first portion onto the element isolation layer, the second portion of the first work function control layer including a first step portion which is on the element isolation layer and has a first thickness, and a second step portion; and a second work function control layer including a third portion surrounding each of the plurality of second semiconductor patterns, a fourth portion extending from the third portion onto the element isolation layer, the fourth portion of the second work function control layer having a second thickness being greater than the first thickness, wherein the first step portion of the first work function control layer is disposed between the second step portion of the first work function control layer and the first active area, and wherein the second step portion of the first work function control layer is connected to the second work function control layer.

17. The integrated circuit device of claim 16, wherein the second work function control layer includes a lower second work function control layer and an upper second work function control layer which are arranged sequentially on the plurality of second semiconductor patterns, and the upper second work function control layer has a third thickness that is identical to the first thickness of the first work function control layer.

18. The integrated circuit device of claim 16, further comprising a gate insulation layer between the uppermost first semiconductor pattern of the plurality of first semiconductor patterns and the first portion of the first work function control layer and between the element isolation layer and the second portion of the first work function control layer, wherein the gate insulation layer comprises a recess region at a portion where the gate insulation layer overlaps the first step portion of the first work function control layer.

\* \* \* \* \*